(12) United States Patent
Lee

(10) Patent No.: US 9,954,195 B2
(45) Date of Patent: Apr. 24, 2018

(54) ORGANIC LIGHT EMITTING DEVICE AND METHOD FOR MANUFACTURING THE SAME

(71) Applicant: LG Display Co., Ltd., Seoul (KR)

(72) Inventor: Yeon Keun Lee, Daejeon (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/422,081

(22) Filed: Feb. 1, 2017

(65) Prior Publication Data

US 2017/0149013 A1 May 25, 2017

Related U.S. Application Data

(63) Continuation of application No. 14/701,069, filed on Apr. 30, 2015, now Pat. No. 9,601,555, which is a
(Continued)

(30) Foreign Application Priority Data

Nov. 16, 2012 (KR) .......... 10-2012-0130055

(51) Int. Cl.
*H01L 51/52* (2006.01)
*H01L 27/32* (2006.01)
(Continued)

(52) U.S. Cl.
CPC ........ *H01L 51/5228* (2013.01); *H01L 27/329* (2013.01); *H01L 27/3279* (2013.01);
(Continued)

(58) Field of Classification Search
CPC ............. H01L 51/5228; H01L 51/5212; H01L 51/0097; H01L 27/329; H01L 27/3279; H01L 51/5268; H01L 51/5246; H01L 51/5253; H01L 2251/5338; H01L 2251/558; H01L 51/56; H01L 2251/5392
See application file for complete search history.

(56) References Cited

U.S. PATENT DOCUMENTS 5,399,936 A 3/1995 Namika et al.
2005/0116628 A1 6/2005 Lee
(Continued)

FOREIGN PATENT DOCUMENTS

EP 1003229 A1 5/2000
EP 2497810 A1 6/2012
(Continued)

*Primary Examiner* — Michael Carter
*Assistant Examiner* — Mohammed R Alam
(74) *Attorney, Agent, or Firm* — Dentons US LLP

(57) ABSTRACT

Disclosed is an organic light emitting device (OLED) that may include a first electrode on a substrate, the first electrode having a pattern of a plurality of cells, with each cell defined with an emitting area and a non-emitting area; a second electrode facing the first electrode; an organic layer between the first electrode and the second electrode; a short-circuit preventing layer contacting at least a portion of the first electrode; and an auxiliary electrode on the short-circuit preventing layer in the non-emitting area of each cell, wherein an aperture ratio of the short-circuit preventing layer and the auxiliary electrode in each cell is 30% or more.

23 Claims, 16 Drawing Sheets

Related U.S. Application Data continuation of application No. PCT/KR2013/010414, filed on Nov. 15, 2013.

(51) Int. Cl.
  *H01L 51/00* (2006.01)
  *H01L 51/56* (2006.01)

(52) U.S. Cl.
  CPC ...... *H01L 51/0097* (2013.01); *H01L 51/5212* (2013.01); *H01L 51/5268* (2013.01); *H01L 51/5246* (2013.01); *H01L 51/5253* (2013.01); *H01L 51/56* (2013.01); *H01L 2251/5338* (2013.01); *H01L 2251/5392* (2013.01); *H01L 2251/558* (2013.01)

(56) References Cited

U.S. PATENT DOCUMENTS

| | | |
|---|---|---|
| 2005/0225234 A1 | 10/2005 | Tyan et al. |
| 2006/0186802 A1 | 8/2006 | Cok |
| 2007/0257608 A1* | 11/2007 | Tyan ................ C03C 17/38 313/506 |
| 2011/0001864 A1* | 1/2011 | Okinaka ............ H01L 51/5012 348/333.01 |
| 2011/0121346 A1 | 5/2011 | Yamada |
| 2011/0220957 A1 | 9/2011 | Hartmann et al. |
| 2012/0153831 A1* | 6/2012 | Kasai ................ H01L 51/5203 315/121 |
| 2012/0181933 A1* | 7/2012 | Ma ................ H01L 27/3281 315/121 |
| 2012/0228591 A1* | 9/2012 | Sawabe ............ H01L 51/5268 257/40 |
| 2013/0025682 A1 | 1/2013 | Miwa |
| 2013/0082589 A1 | 4/2013 | So |
| 2013/0187186 A1 | 7/2013 | Popp |

FOREIGN PATENT DOCUMENTS

| | | |
|---|---|---|
| JP | 5-307997 A | 11/1993 |
| JP | 1999-339970 A | 12/1999 |
| JP | 2001196191 A | 7/2001 |
| JP | 2005-166671 A | 6/2005 |
| JP | 2011-513925 A | 4/2011 |
| JP | 2011-338770 A | 12/2011 |
| KR | 10-2006-0130729 A | 12/2006 |
| KR | 10-2011-0102373 A | 9/2011 |
| TW | 201031263 A1 | 8/2010 |

\* cited by examiner

[Figure 1]
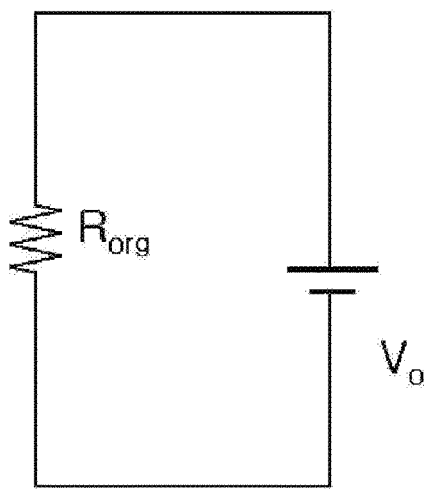
[Figure 2]
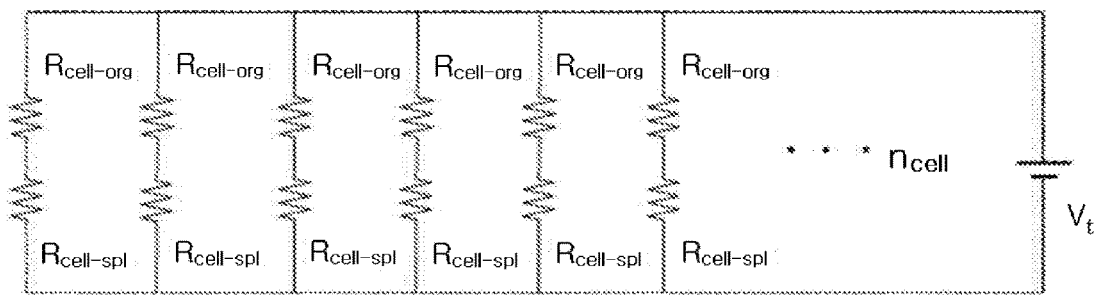

[Figure 3]
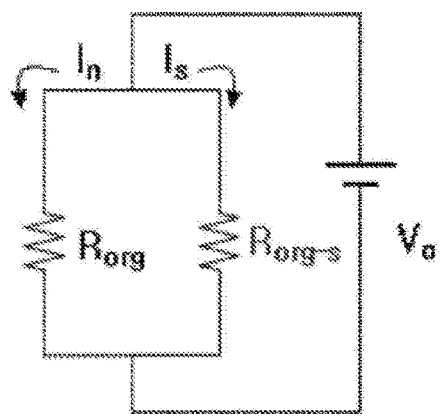
[Figure 4]
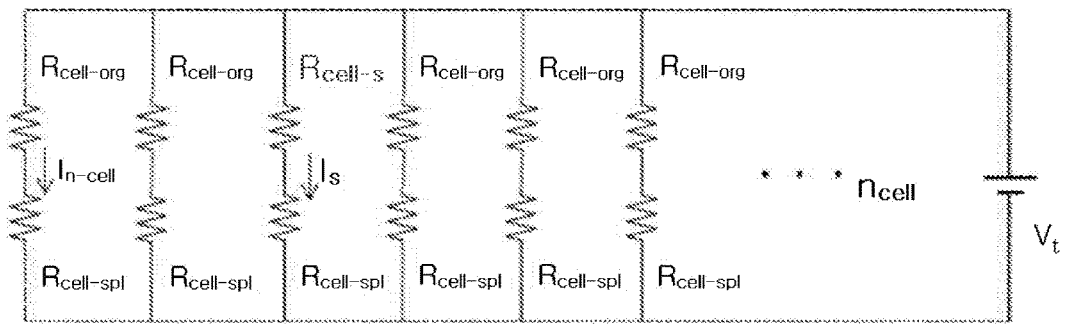

[Figure 5]
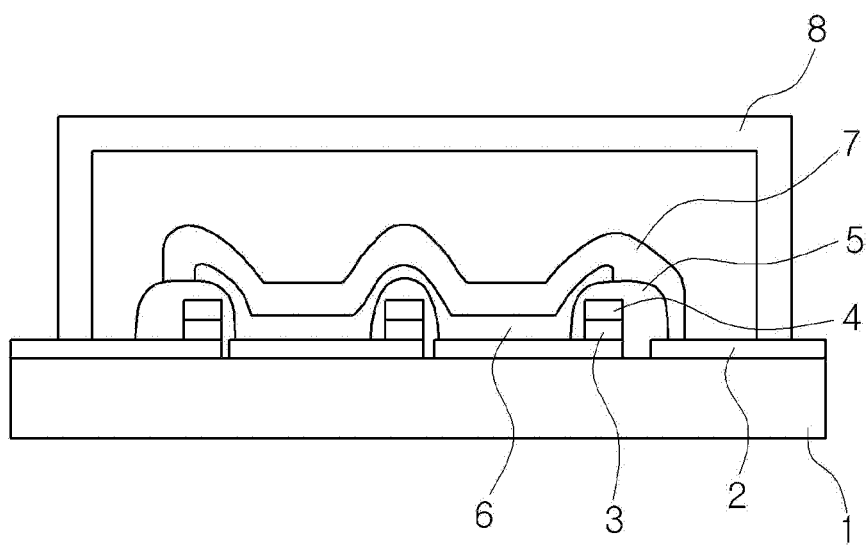

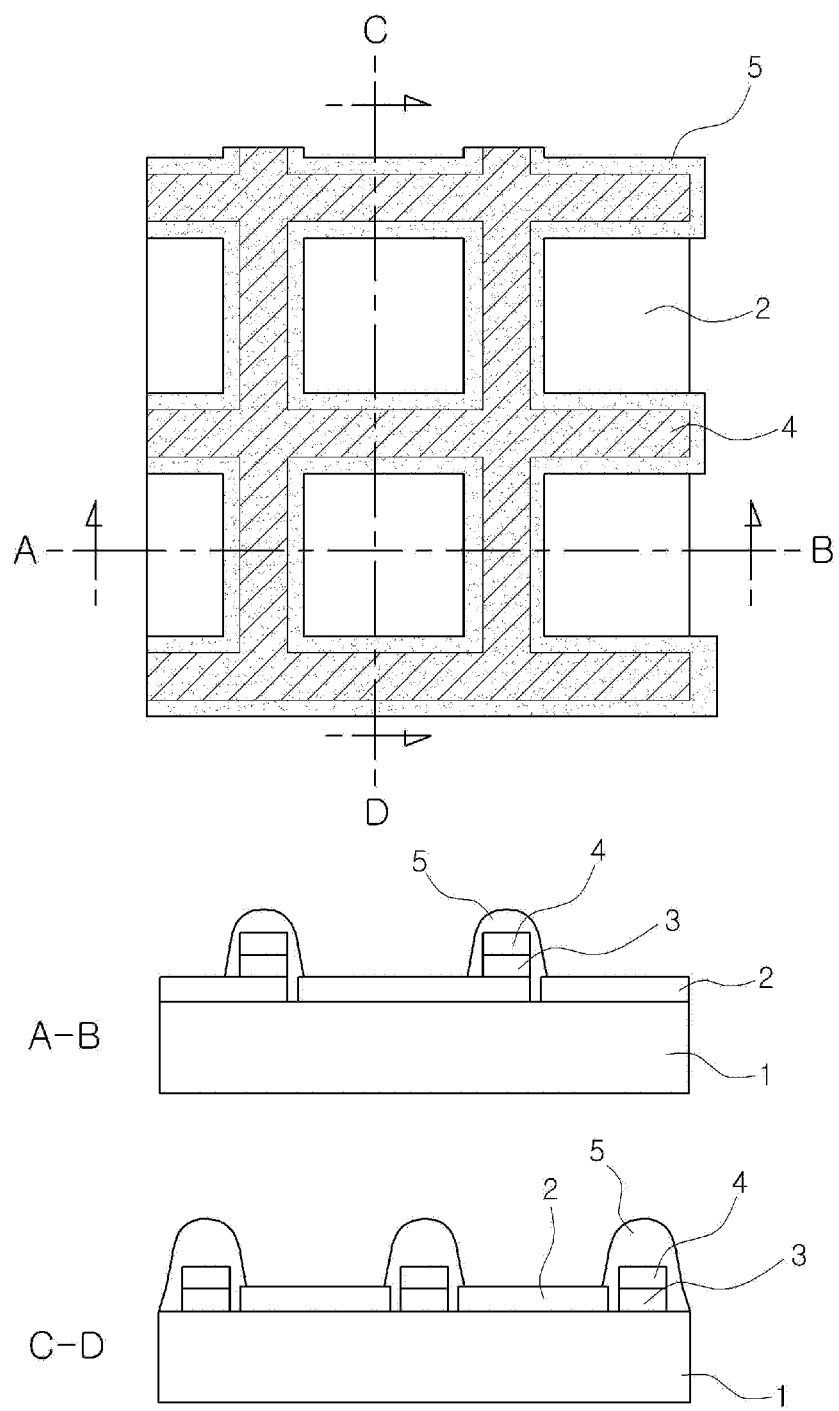
[Figure 6]

[Figure 7]
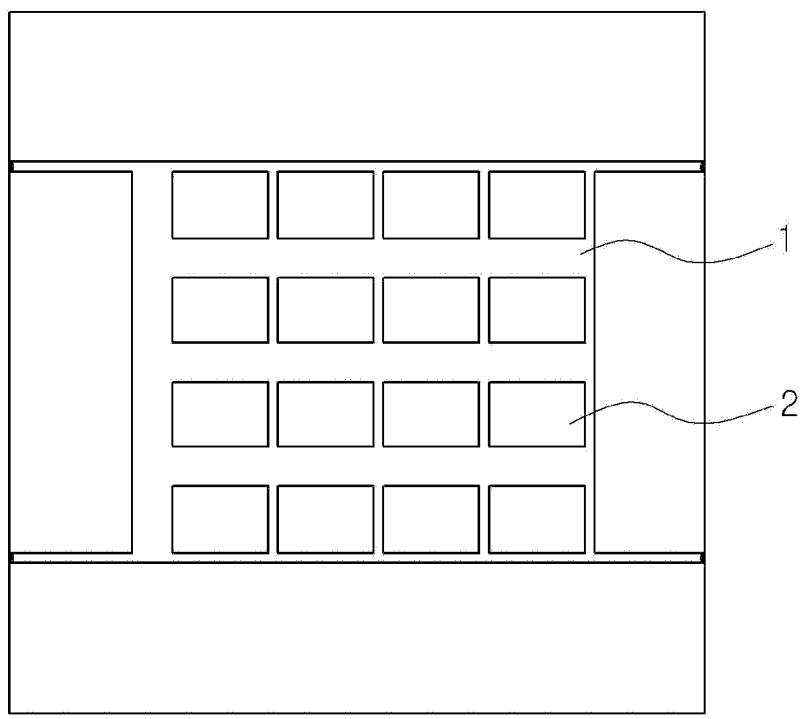

[Figure 8]
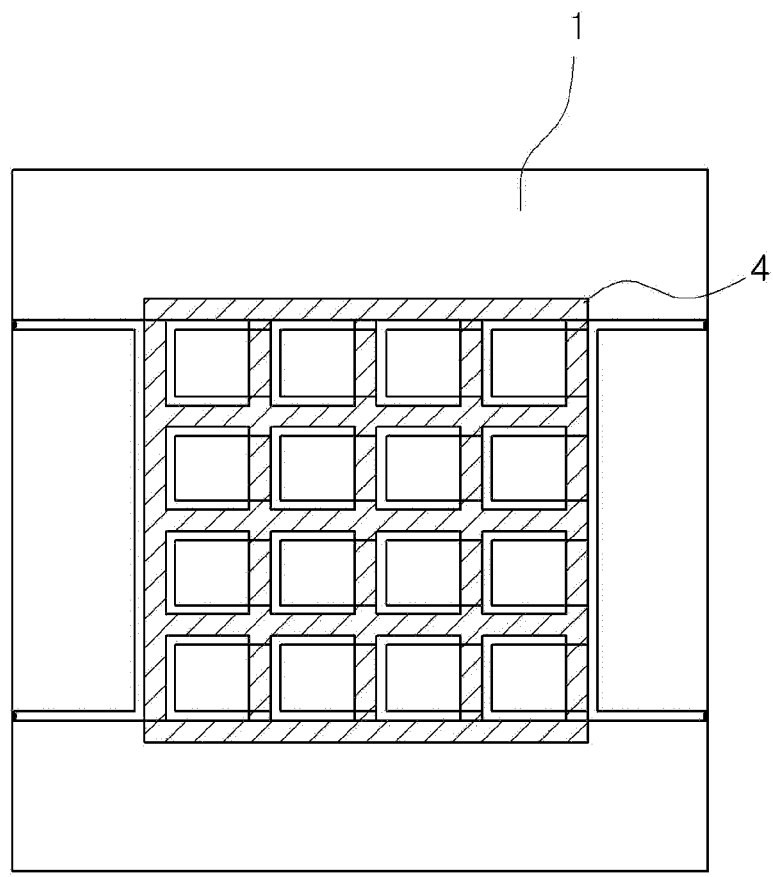

[Figure 9]
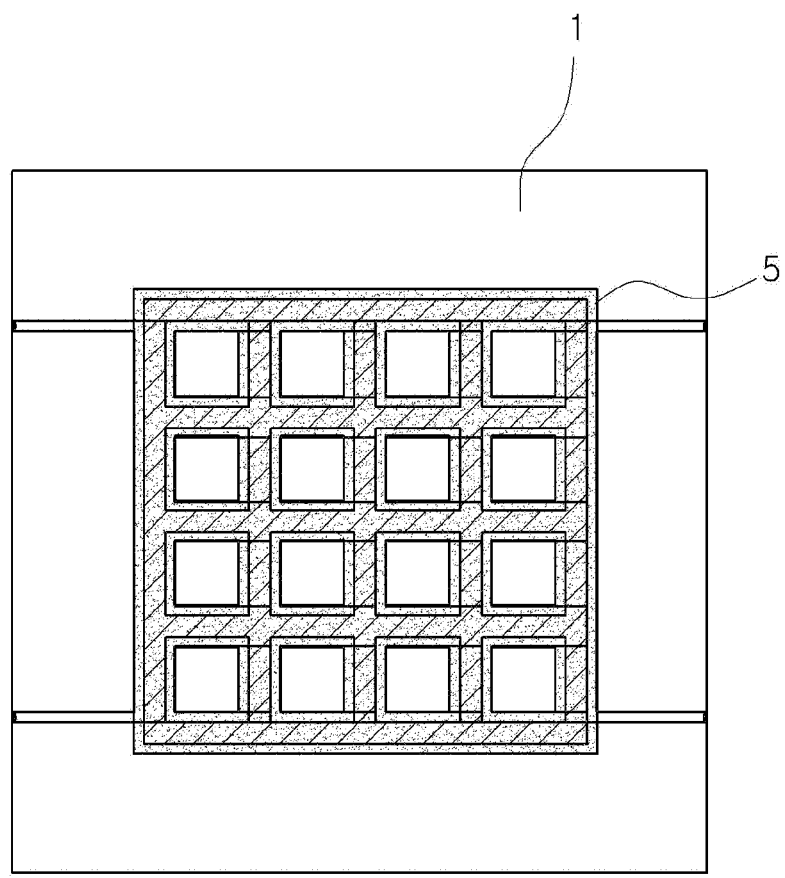

[Figure 10]
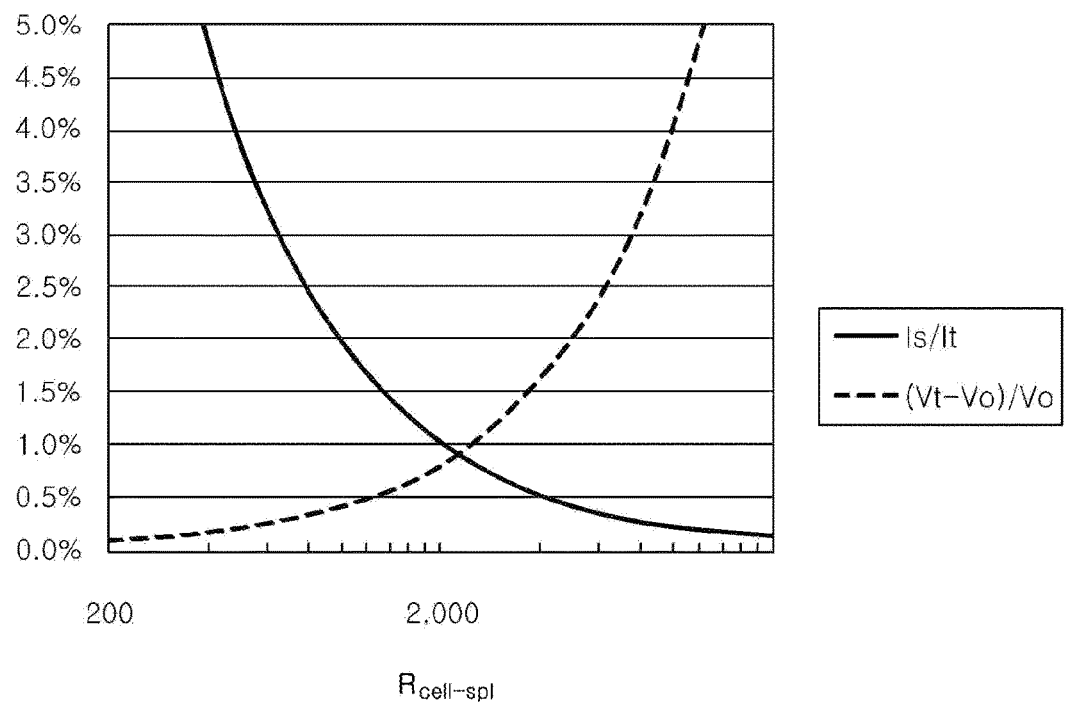

[Figure 11]
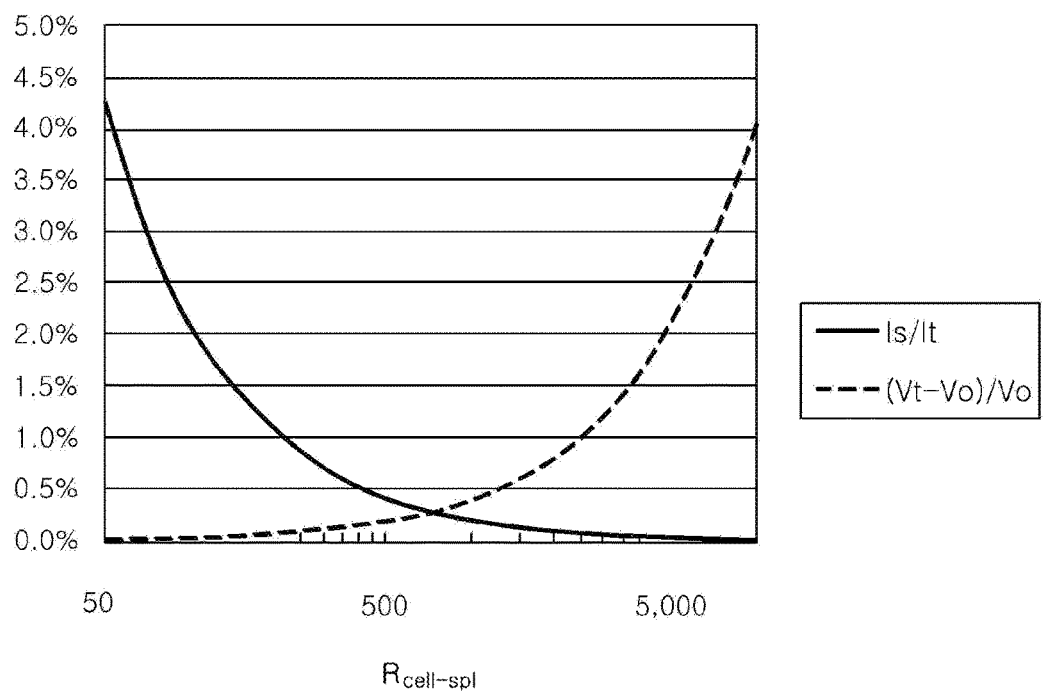

[Figure 12]
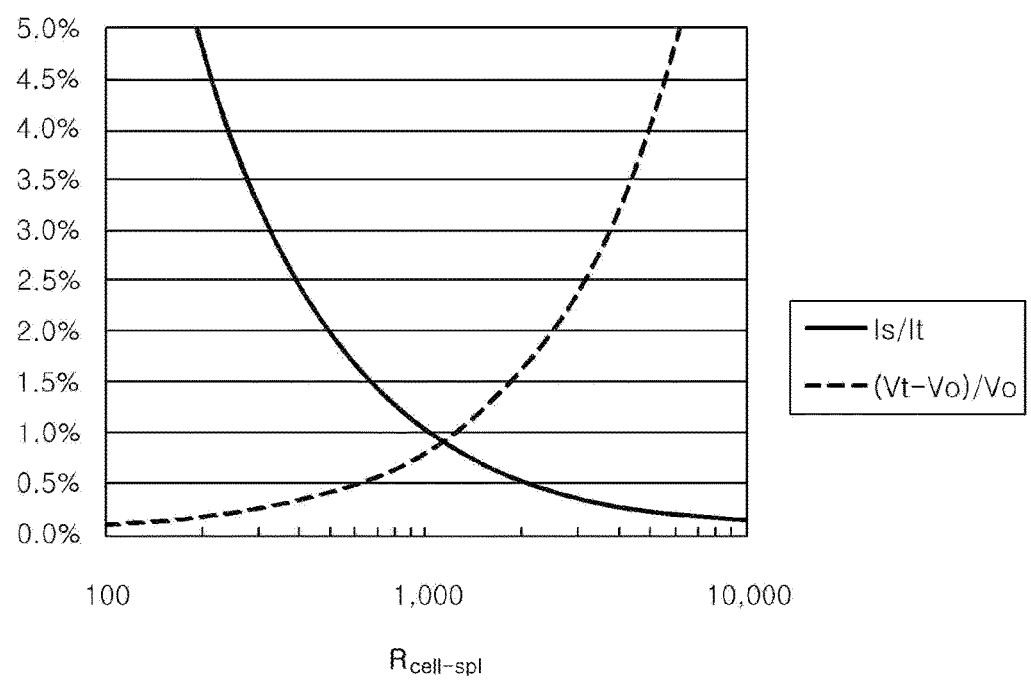

[Figure 13]
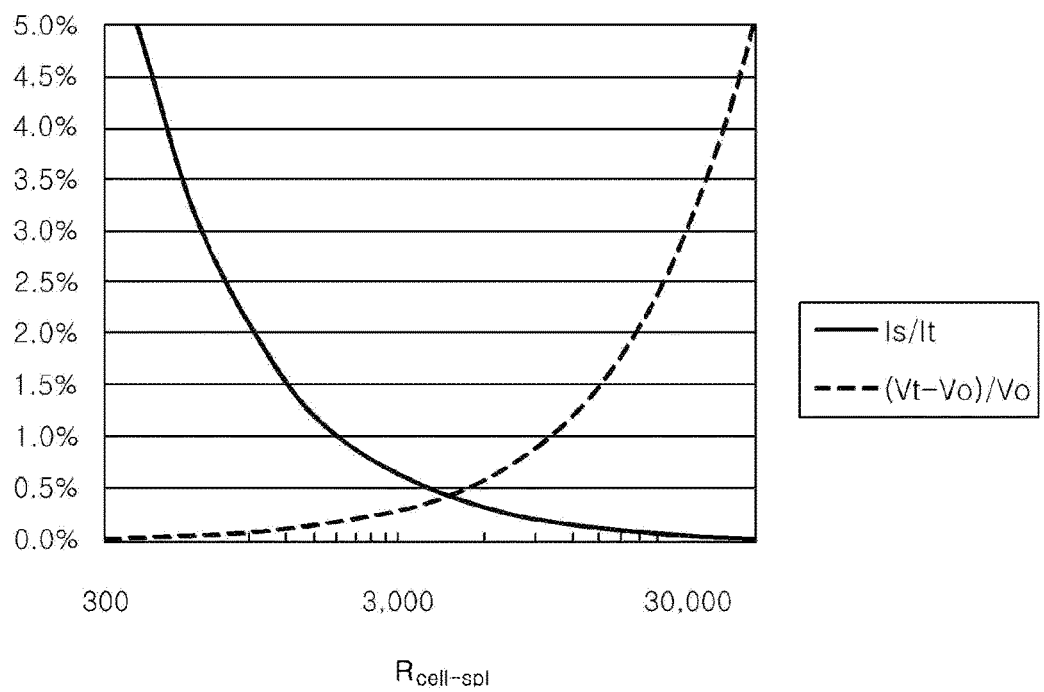

[Figure 14]
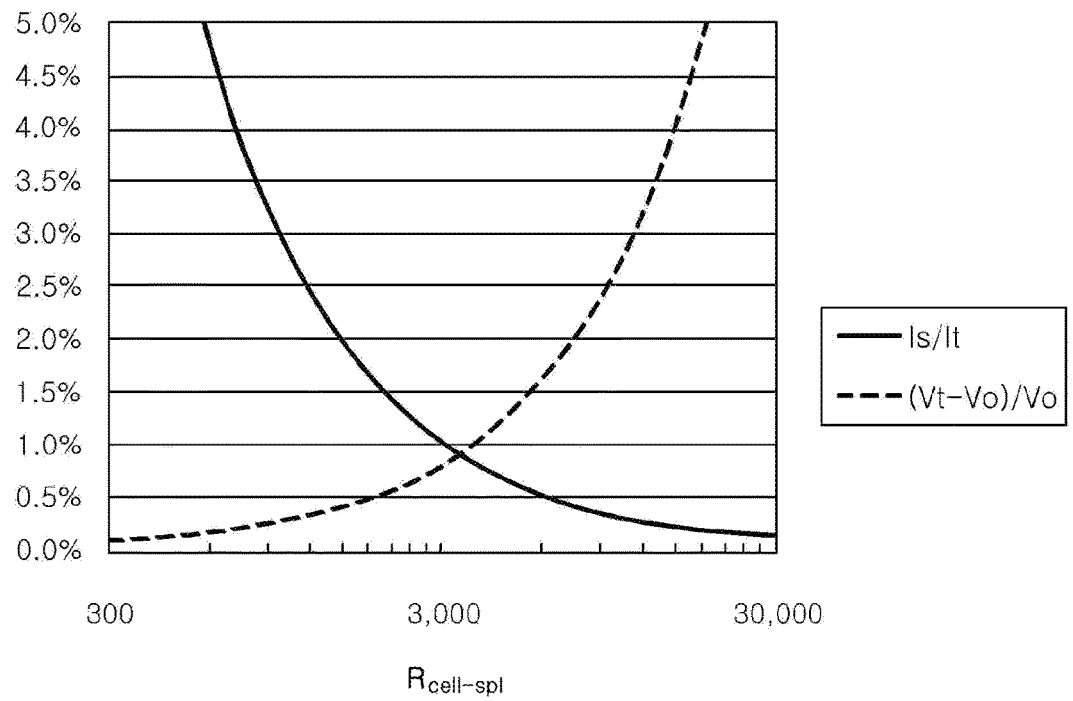

[Figure 15]
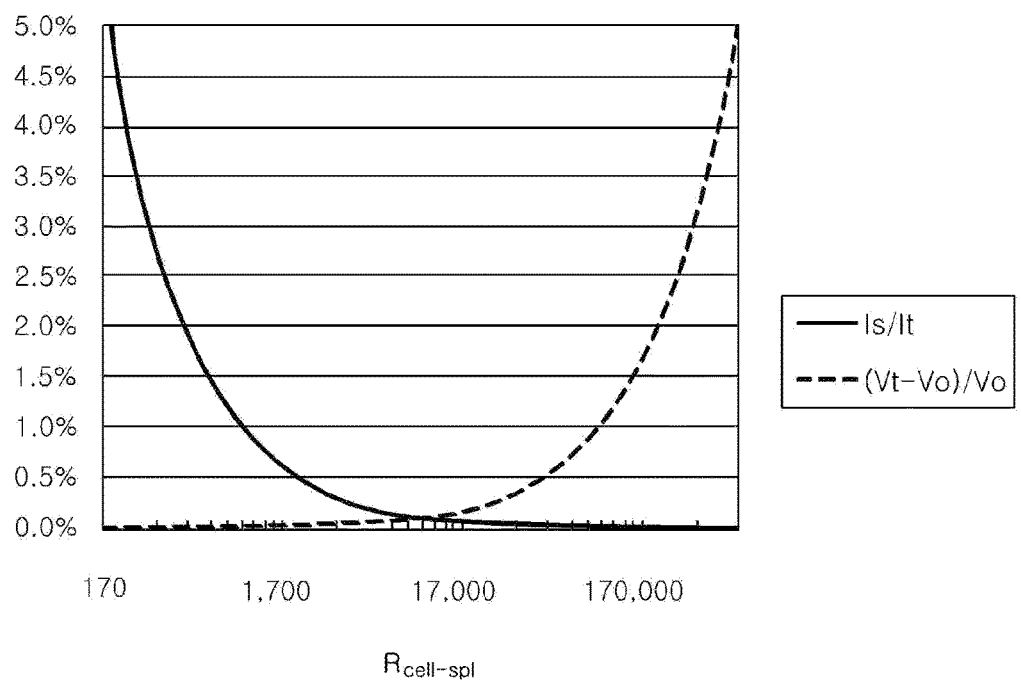

[Figure 16]
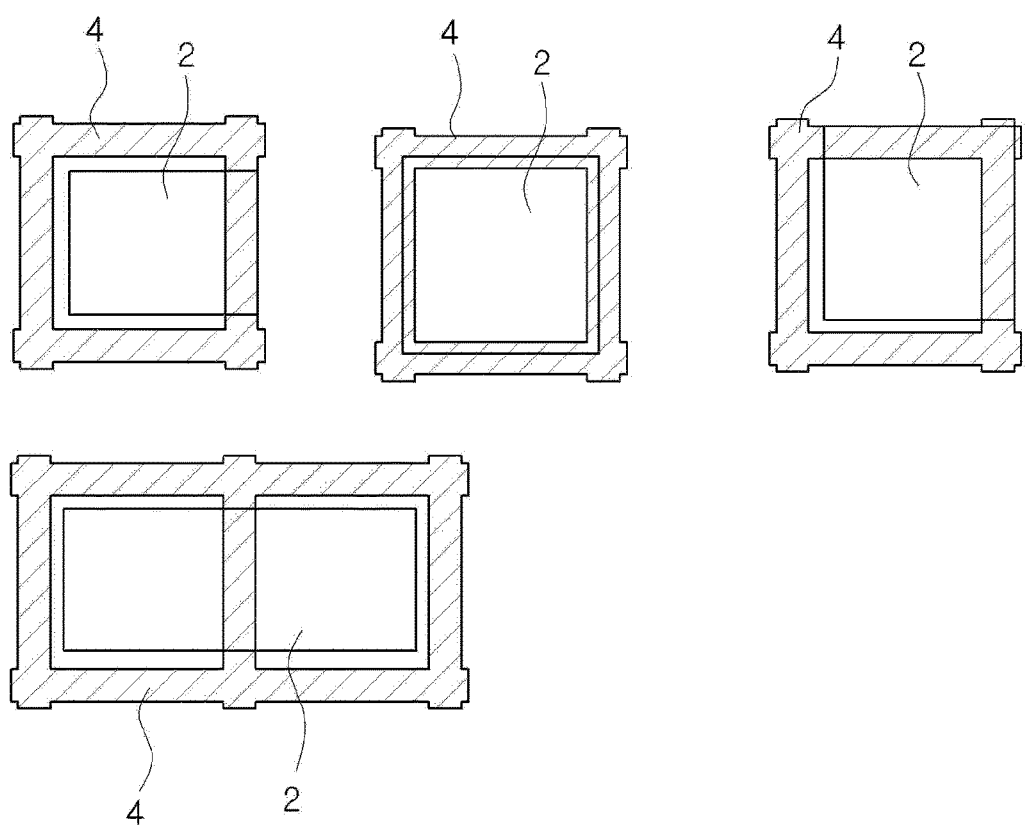

[Figure 17]
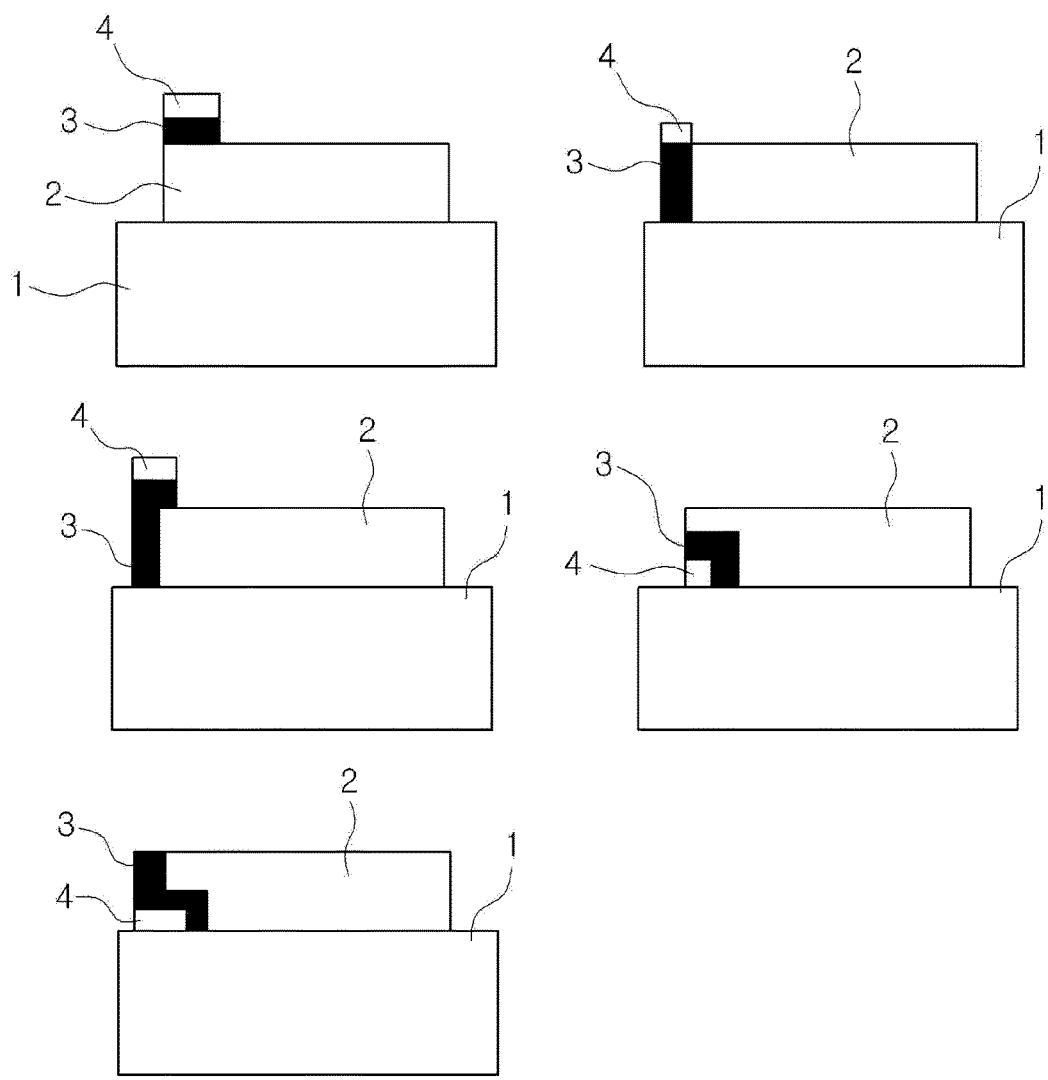

[Figure 18]
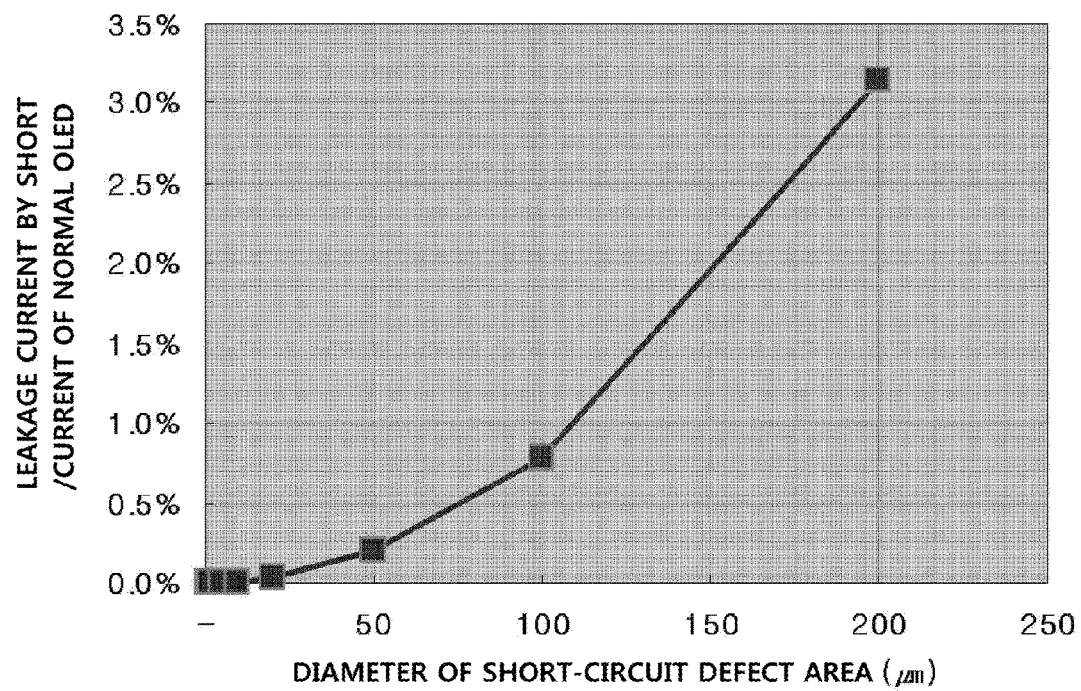

ORGANIC LIGHT EMITTING DEVICE AND METHOD FOR MANUFACTURING THE SAME

This application is a Continuation of U.S. patent application Ser. No. 14/701,069 filed Apr. 30, 2015, which is a Continuation Bypass of International Application No. PCT/KR2013/010414, filed Nov. 15, 2013, and claims the benefit of Korean Application No. 10-2012-0130055, filed on Nov. 16, 2012, all of which are hereby incorporated by reference in their entirety for all purposes as if fully set forth herein.

TECHNICAL FIELD

The present specification relates to an organic light emitting device (OLED) and a method for manufacturing the OLED. The present specification claims priority to and the benefit of Korean Patent Application No. 10-2012-0130055 filed in the Korean Intellectual Property Office on Nov. 16, 2012, the entire contents of which are incorporated herein by reference for all purposes as if fully set forth herein.

BACKGROUND ART

An organic light emitting phenomenon refers to a phenomenon of converting electrical energy to light energy using an organic material. That is, when positioning an appropriate organic layer between an anode and a cathode, and then applying a voltage between two electrodes, holes are injected into the organic layer from the anode and electrons are injected into the organic layer from the cathode. Excitons are generated when the injected holes and electrons encounter each other, and light is generated when the excitons fall down to a lower energy state.

Since an interval between the anode and the cathode is small, an organic light emitting device (OLED) is easy to have a short-circuit defect. Due to a pinhole, a crack, a step and coating roughness in a structure of the OLED, and the like, the anode and the cathode may directly contact with each other. The thickness of the organic layer may become thinner in such a defect zone. The defect zone may provide a low resistance path in which current easily flows, thereby reducing or preventing sufficient current from flowing through the OLED in an extreme case. Accordingly, light emitting output of the OLED may decrease or disappear.

In a multi-pixel OLED, such a short-circuit defect may generate a dead pixel of not emitting light or emitting light less than the average light intensity, thereby degrading the display quality. In the case of a lighting or other low resolution usages, a large portion of the OLED device may not operate due to the short-circuit defect.

Due to concerns about the short-circuit defect, manufacturing of an OLED is generally performed in a clean room. However, even a clean environment may not effectively remove the short-circuit defect. In many cases, to decrease the number of short-circuit defects by increasing the interval between two electrodes, the thickness of the organic layer may be unnecessarily increased as compared to a thickness desired to operate the OLED. Such a method may add cost in manufacturing the OLED. Further, the method may not completely remove the short-circuit defect.

PRIOR ART REFERENCE

Korean Laid-Open Publication No. 10-2006-0130729 (published on Dec. 19, 2006)

DISCLOSURE

Technical Problem

The present invention is to provide an organic light emitting device (OLED) that may operate within a normal range even in a case in which a factor capable of causing a short-circuit defect is present, that is, even in a case in which the short-circuit defect occurs, and a method for manufacturing the OLED.

Technical Solution

An exemplary embodiment of the present specification provides an organic light emitting device (OLED), including: a substrate; a first electrode provided on the substrate; a second electrode provided to face the first electrode; at least one organic layer provided between the first electrode and the second electrode; an auxiliary electrode of the first electrode; and a short-circuit preventing layer provided in contact with at least a portion of the first electrode, and provided between the auxiliary electrode and the first electrode.

Current of the OLED may be provided to flow in a direction of the auxiliary electrode, the short-circuit preventing layer, the first electrode, the organic layer, and the second electrode, or in a reverse direction thereof.

The first electrode may be formed using one cell or formed using at least two cells.

Another exemplary embodiment of the present specification provides a method for manufacturing the OLED. Specifically, another exemplary embodiment of the present specification provides a method for manufacturing the OLED, including: preparing a substrate; forming a first electrode on the substrate; forming a short-circuit preventing layer to be provided in contact with at least a portion of the first electrode; forming an auxiliary electrode layer by disposing the short-circuit preventing layer between the first electrode and the auxiliary electrode layer; forming at least one organic layer on the first electrode; and forming a second electrode on the organic layer.

Also, yet another exemplary embodiment of the present specification provides a display device including the OLED.

Also, still another exemplary embodiment of the present specification provides a lighting device including the OLED.

It is to be understood that both the foregoing general description and the following detailed description are exemplary and explanatory and are intended to provide further explanation of the invention as claimed.

Advantageous Effects

An organic light emitting device (OLED) according to the present specification may have an effect of reducing or preventing a short-circuit defect.

Also, an OLED according to the present specification may normally execute a function of the OLED even though a short circuit occurs due to a defect of a substrate itself.

Also, an OLED according to the present specification may stably operate without increasing a leakage current amount even though an area size of a short-circuit occurrence point increases.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

DESCRIPTION OF DRAWINGS

The accompanying drawings, which are included to provide a further understanding of the invention and are incorporated in and constitute a part of this specification, illustrate embodiments of the invention and together with the description serve to explain the principles of the invention.

FIG. 1 illustrates a circuit diagram of a case in which a short circuit does not occur in an organic light emitting device (OLED) in which a short-circuit preventing layer is absent.

FIG. 2 illustrates a circuit diagram of a case in which a short circuit does not occur in an OLED including a short-circuit preventing layer according to an exemplary embodiment of the present specification.

FIG. 3 illustrates a circuit diagram of a case in which a short circuit occurs in an OLED in which a short-circuit preventing layer is absent.

FIG. 4 illustrates a circuit diagram of a case in which a short circuit occurs in an OLED including a short-circuit preventing layer according to an exemplary embodiment of the present specification.

FIGS. 5 and 6 illustrate an OLED according to an exemplary embodiment of the present specification.

FIG. 7 illustrates a pattern of a first electrode in an OLED according to an exemplary embodiment of the present specification.

FIG. 8 illustrates a state acquired after forming a short-circuit preventing layer and an auxiliary electrode layer on a first electrode, then patterning the short-circuit preventing layer and the auxiliary electrode layer in an OLED according to an exemplary embodiment of the present specification.

FIG. 9 illustrates a state acquired after forming an insulating layer in an OLED according to an exemplary embodiment of the present specification.

FIG. 10 illustrates an operating voltage increase rate $((V_t-V_o)/V_o)$ based on resistance $(R_{cell-spl})$ in a thickness direction of a short-circuit preventing layer and a numerical value of leakage current to operating current $(I_s/I_t)$ on one cell in an OLED according to Example 1 of the present specification.

FIG. 11 illustrates an operating voltage increase rate $((V_t-V_o)/V_o)$ based on resistance $(R_{cell-spl})$ of a short-circuit preventing layer and a numerical value of leakage current to operating current $(I_s/I_t)$ on one cell in an OLED according to Example 2 of the present specification.

FIG. 12 illustrates an operating voltage increase rate $((V_t-V_o)/V_o)$ based on resistance $(R_{cell-spl})$ in a thickness direction of a short-circuit preventing layer and a numerical value of leakage current to operating current $(I_s/I_t)$ on one cell in an OLED according to Example 3 of the present specification.

FIG. 13 illustrates an operating voltage increase rate $((V_t-V_o)/V_o)$ based on resistance $(R_{cell-spl})$ in a thickness direction of a short-circuit preventing layer and a numerical value of leakage current to operating current $(I_s/I_t)$ on one cell in an OLED according to Example 4 of the present specification.

FIG. 14 illustrates an operating voltage increase rate $((V_t-V_o)/V_o)$ based on resistance $(R_{cell-spl})$ in a thickness direction of a short-circuit preventing layer and a numerical value of leakage current to operating current $(I_s/I_t)$ on one cell in an OLED according to Example 5 of the present specification.

FIG. 15 illustrates an operating voltage increase rate $((V_t-V_o)/V_o)$ based on resistance $(R_{cell-spl})$ in a thickness direction of a short-circuit preventing layer and a numerical value of leakage current to operating current $(I_s/I_t)$ on one cell in an OLED according to Example 6 of the present specification.

FIGS. 16 and 17 illustrate examples of a short-circuit preventing layer and an auxiliary electrode provided on one cell of a patterned first electrode in an OLED according to an exemplary embodiment of the present specification.

FIG. 18 illustrates an adverse effect resulting from a short-circuit defect area in a case in which a short-circuit preventing layer is formed on an entire area of a top surface of a first electrode.

ILLUSTRATED EMBODIMENTS

Reference will now be made in detail to embodiments of the present invention, examples of which are illustrated in the accompanying drawings. The same reference numbers may be used throughout the drawings to refer to the same or like parts.

An exemplary embodiment of the present specification provides an organic light emitting device (OLED), including: a substrate; a first electrode provided on the substrate; a second electrode provided to face the first electrode; at least one organic layer provided between the first electrode and the second electrode; an auxiliary electrode of the first electrode; and a short-circuit preventing layer provided in contact with at least a portion of the first electrode, and provided between the auxiliary electrode and the first electrode.

Also, according to an exemplary embodiment of the present specification, current of the OLED may be provided to flow in a direction of the auxiliary electrode, the short-circuit preventing layer, the first electrode, the organic layer, and the second electrode. Alternatively, according to an exemplary embodiment of the present specification, current of the OLED may be provided to flow in a direction of the second electrode, the organic layer, the first electrode, the short-circuit preventing layer, and the auxiliary electrode. In this case, an external voltage applying terminal may be provided to the auxiliary electrode and the second electrode.

According to an exemplary embodiment of the present specification, the short-circuit preventing layer may be provided in contact with at least one of a top surface, a bottom surface, and a side surface of the first electrode.

The short-circuit preventing layer may be formed in contact with at least one of the top surface, the bottom surface, and the side surface of the first electrode. Also, the short-circuit preventing layer may be formed in contact with a portion of the top surface and a portion of the side surface of the first electrode. Further, the short-circuit preventing layer may be formed in contact with a portion of the bottom surface and a portion of the side surface of the first electrode.

According to an exemplary embodiment of the present specification, the short-circuit preventing layer may be provided in contact with at least one of the top surface, the bottom surface, and the side surface of the first electrode, the auxiliary electrode may be provided in contact with at least a portion of the short-circuit preventing layer, and the auxiliary electrode may not directly contact with the first electrode.

According to an exemplary embodiment of the present specification, the short-circuit preventing layer may be provided in contact with at least one of the top surface and the side surface of the first electrode and the auxiliary electrode may be provided in contact with a top surface of the short-circuit preventing layer.

According to an exemplary embodiment of the present specification, the short-circuit preventing layer may be provided in contact with at least one of the side surface and the bottom surface of the first electrode and the auxiliary electrode may be provided in contact with a bottom surface of the short-circuit preventing layer.

According to an exemplary embodiment of the present specification, the short-circuit preventing layer may be provided in contact with the top surface of the first electrode or the substrate and the auxiliary electrode may be provided in contact with the top surface of the short-circuit preventing layer According to an exemplary embodiment of the present specification, the auxiliary electrode may be provided in contact with the top surface of the substrate and the short-circuit preventing layer may be provided between the auxiliary electrode and the first electrode.

A light emitting area refers to an area in which light emitted from the light emitting layer of the organic layer is emitted through the first electrode and/or the second electrode. For example, in an OLED according to an exemplary embodiment of the present specification, the light emitting area may be formed on at least a portion of an area of the first electrode in which a short-circuit preventing layer and/or an auxiliary electrode are not formed in an area in which the first electrode is formed on the substrate. Also, a non-emitting area refers to a remaining area excluding the light emitting area.

According to an exemplary embodiment of the present specification, at least one of the cells may include a light emitting area and a non-emitting area, and an aperture ratio of each cell may be 30% or more.

According to an exemplary embodiment of the present specification, the first electrode may be formed using one cell.

According to an exemplary embodiment of the present specification, the first electrode may be formed using one cell, and may include a light emitting area and a non-emitting area, and a thickness of the light emitting area and a thickness of the non-emitting area may be identical to each other or different from each other.

According to an exemplary embodiment of the present specification, when the first electrode is formed using one cell, the thickness of the light emitting area and the thickness of the non-emitting area in the first electrode may be identical to each other and an area corresponding to the auxiliary electrode and/or the short-circuit preventing layer may become the non-emitting area and a remaining area may become the light emitting area.

According to an exemplary embodiment of the present specification, when the first electrode is formed using one cell, the thickness of the light emitting area and the thickness of the non-emitting area in the first electrode may be different from each other. The light emitting area may be a portion having a relatively thick thickness and the non-emitting area may be a portion having a relatively thin thickness.

According to an exemplary embodiment of the present specification, when the first electrode is formed using one cell and the thickness of the light emitting area and the thickness of the non-emitting area are different from each other, the light emitting area may be provided in a predetermined shape. Specifically, the light emitting area may be provided in a polygonal shape, such as a triangular shape, a rectangular shape, and a hexagonal shape, and may be provided in an amorphous shape.

According to an exemplary embodiment of the present specification, a thickness of a portion including the light emitting area of the first electrode may be 10 to 1,000 folds of a portion excluding the light emitting area.

The term "pattern" indicates that the pattern is formed to cover only an area in a shape suitable for a final utilization, instead of covering an entire area of a lower layer in which a corresponding layer is provided, for example, the substrate or the first electrode.

According to an exemplary embodiment of the present specification, the first electrode may be formed in a pattern. The pattern of the first electrode may include the light emitting area.

According to an exemplary embodiment of the present specification, the first electrode may include at least two cells and be formed in a pattern in which respective cells are separated from each other.

The term "cell" is used as a minimum unit of the first electrode formed on the substrate. Specifically, when the first electrode is formed using one cell, the cell may be formed so that the first electrode is not separated from the same plane of the substrate. Alternatively, when the first electrode is formed using at least two cells, the cell may be used as the minimum unit of the first electrode formed on the substrate and the first electrode may be formed in a pattern in which the respective cells are separated from each other. A minimum unit of the first electrode may be used as one unit physically connected. Also, the cell may have a closed figure shape. Specifically, the cell may be provided in a polygonal shape, such as a triangular shape, a rectangular shape, and a hexagonal shape, and may be provided in an amorphous shape.

According to an exemplary embodiment of the present specification, each cell refers to the aforementioned first electrode. All of the aforementioned relationships or relationships to be described later between the first electrode and the short-circuit preventing layer or the auxiliary electrode may be applied to each cell.

According to an exemplary embodiment of the present specification, the auxiliary electrode and the short-circuit preventing layer may be disposed by forming a pattern on the non-emitting area. That is, the light emitting area may be partitioned by forming the pattern on a portion excluding the light emitting area. For example, the pattern may be formed in a shape of a mesh pattern to partition the light emitting area. The mesh pattern may be provided in a polygonal shape, such as a triangular shape, a rectangular shape, and a hexagonal shape, and may be provided in an amorphous shape.

Also, when the short-circuit preventing layer is formed by forming the pattern on the non-emitting area, a portion of the short-circuit preventing layer may be positioned on the substrate and a remaining portion thereof may also be positioned on the first electrode.

According to an exemplary embodiment of the present specification, an aperture ratio of the short-circuit preventing layer and the auxiliary electrode may be 30% or more. Specifically, the aperture ratio of the short-circuit preventing layer and the auxiliary electrode may be 50% or more. More specifically, the aperture ratio of the short-circuit preventing layer and the auxiliary electrode may be 70% or more.

The aperture ratio of the short-circuit preventing layer and the auxiliary electrode indicates a ratio of an area not occupied by the short-circuit preventing layer and the auxiliary electrode in an entire area of one or each cell defined by the first electrode. The higher the aperture ratio, the higher luminance. Accordingly, it may become brighter and an amount of power consumption may also be decreased.

According to an exemplary embodiment of the present specification, when the first electrode includes at least two cells separated from each other, the short-circuit preventing layer may be provided in contact with at least a portion of each cell of the pattern. Specifically, according to an exemplary embodiment of the present specification, the short-circuit preventing layer may contact with at least a portion of each cell.

When the short-circuit preventing layer contacts with at least a portion of each cell, it may be possible to prevent all the operating current from flowing into a short-circuit defect portion by the short-circuit preventing layer even though the short-circuit defect occurs in one cell. That is, the short-circuit preventing layer functions to control an amount of leakage current resulting from the short-circuit defect not to increase unlimitedly. Accordingly, remaining cells in which the short-circuit defect is absent may normally operate.

When the short-circuit defect occurs in the OLED, the short-circuit preventing layer may function to enable an operation of the OLED regardless of the short-circuit defect. Also, the short-circuit preventing layer may also function to prevent the short-circuit defect.

The short-circuit defect may occur in a case in which the second electrode directly contacts with the first electrode. Alternatively, the short-circuit defect may occur even in a case in which due to a decrease in a thickness of or deformation of the organic layer positioned between the first electrode and the second electrode, a function of the organic layer is lost and thereby the first electrode and the second electrode contact with each other. When the short circuit defect occurs, a low current path may be provided to the OLED, thereby enabling the OLED to anomalously operate. Due to leakage current that direct (DC) current flows from the first electrode to the second electrode by the short-circuit defect, current of the OLED may flow avoiding a zero-defect zone. It may decrease the light emitting output of the OLED. In a serious case, the OLED may not operate. Also, when current distributed and thereby flowing over a wide area of organic materials is concentrated and thereby flows at a short-circuit occurrence point, high heat is locally generated and the OLED may be broken or a fire may occur.

However, the short-circuit preventing layer according to an exemplary embodiment of the present specification is positioned between the auxiliary electrode and the first electrode, and functions as a current migration path before the short-circuit defect occurs, and may minimize an increase in operating voltage of the OLED occurring due to the short-circuit preventing layer. When the short-circuit defect occurs, it may be possible to prevent a degradation in efficiency of the OLED and to enable the OLED to normally operate by allowing only a small amount of current to leak to the short-circuit occurrence point.

When the short-circuit defect occurs, the short-circuit preventing layer functions to apply appropriate resistance and thereby prevent the current from leaking through the short-circuit defect portion. To this end, the short-circuit preventing layer may have a thickness and resistivity suitable for decreasing the leakage current resulting from the short-circuit defect and the light emitting efficiency loss associated therewith.

According to an exemplary embodiment of the present specification, the short-circuit preventing layer and the auxiliary electrode may be formed in contact with each other. That is, when voltage is applied to the OLED, the auxiliary electrode and the short-circuit preventing layer may be electrically connected. Also, the auxiliary electrode may be formed on the short-circuit preventing layer with an area equal to or less than an area of the short-circuit preventing layer.

According to an exemplary embodiment of the present specification, current may be injected into the first electrode through the auxiliary electrode. Further, when the first electrode is patterned, the current is injected into each light emitting area through the auxiliary electrode. In this case, the current may be injected into the auxiliary electrode and may flow into the first electrode through the short-circuit preventing layer.

The OLED according to an exemplary embodiment of the present specification may inject the current into the auxiliary electrode and thereby flow the current into the first electrode through the short-circuit preventing layer. Accordingly, when the short circuit occurs, it may be possible to prevent excessive current from flowing due to the contact between the first electrode and the second electrode. That is, it may be possible to prevent the excessive current resulting from the short-circuit defect from flowing by resistance of the short-circuit preventing layer.

According to an exemplary embodiment of the present specification, the surface resistance of the auxiliary electrode may be 3Ω/□ or less. Specifically, the surface resistance of the auxiliary electrode may be 1Ω/□ or less.

When any one surface resistance of the first electrode and the second electrode having a wide area is higher than a desired level, voltage may vary for each position of the electrode. Accordingly, when a potential difference between the first electrode and the second electrode disposed based on the organic layer varies based on a position, the luminance uniformity of the OLED may be degraded. Accordingly, in order to decrease the surface resistance of the first electrode or the second electrode that is higher than the desired level, the auxiliary electrode may be used. The surface resistance of the auxiliary electrode of the present specification may be 3Ω/□ or less, and specifically, may be 1Ω/□ or less. In the above range, the luminance uniformity of the OLED may be maintained to be high.

By patterning the first electrode or differentiating the thickness of the light emitting area and the thickness of the non-emitting area, the OLED according to an exemplary embodiment of the present specification may control a maximum current amount that may be injected into one light emitting area. By controlling the maximum current amount to be injected into one light emitting area, there is an advantage in that it may be possible to control an amount of leakage current resulting from an increase in a short-circuit defect area. Accordingly, it may be possible to decrease a probability that the entire OLED does not operate due to the short-circuit defect, and it may be possible to disable an operation of only the light emitting area corresponding to the short-circuit occurrence point. Further, in a case in which the short-circuit preventing layer is absent, the leakage current flows into the short-circuit defect occurrence point through the auxiliary electrode and thus, the entire OLED may not operate even though the first electrode is patterned. The operation indicates emitting of light.

According to an exemplary embodiment of the present specification, an insulating layer may be additionally provided between the short-circuit preventing layer and the organic layer, and between the auxiliary electrode and the organic layer; or an insulating layer is additionally provided between the short-circuit preventing layer and the second electrode, and between the auxiliary electrode and the second electrode.

The insulating layer may be provided in a form of surrounding the patterned short-circuit preventing layer and auxiliary electrode. The insulating layer may be formed through a coating or photolithography process. The insulating layer may function to prevent the short-circuit preventing layer from contacting with other layers aside from the first electrode and the auxiliary electrode. Further, the insulating layer may also function to decrease instability of the OLED occurring due to a conductor such as the auxiliary electrode positioned between the first electrode and the second electrode or the short-circuit preventing layer. That is, the insulating layer may function to electrically insulate the auxiliary electrode and the short-circuit preventing layer from the organic layer and the second electrode.

Due to the insulating layer, the auxiliary electrode may contact with only the short-circuit preventing layer or the substrate, in addition to the insulating layer.

According to an exemplary embodiment of the present specification, the short-circuit preventing layer may not contact with the organic layer.

The short-circuit preventing layer may be formed without contacting with the organic layer of the OLED, and may not contact with the organic layer by the insulating layer. Since the short-circuit preventing layer does not contact with an organic material, a material of the short-circuit preventing layer may be widely selected. For example, when a charge injecting layer is positioned on the short-circuit preventing layer, the short-circuit preventing layer may need to have an excellent hole injecting function. However, the short-circuit preventing layer according to an exemplary embodiment of the present specification does not contact with the organic layer and thus, the aforementioned limitation may not be required. Also, the short-circuit preventing layer is provided in an area that does not correspond to the light emitting area and thus, it may be possible to select the material regardless of optical transparency.

When the short-circuit preventing layer is formed over an entire area of the first electrode, a constituent material of the short-circuit preventing layer is desired to be transparent and thus, selection of the material may be limited. However, the short-circuit preventing layer according to an exemplary embodiment of the present specification is formed on the non-emitting area, instead of being formed on the entire area of the first electrode. Therefore, there is an advantage in that both a transparent material and an opaque material can be used for the material of the short-circuit preventing layer.

Accordingly, the short-circuit preventing layer may include the transparent material and may also include the opaque material.

According to an exemplary embodiment of the present specification, the short-circuit preventing layer and/or the auxiliary electrode may be positioned on the non-emitting area of the OLED.

According to an exemplary embodiment of the present specification, the short-circuit preventing layer may be formed on only a partial area on the substrate, instead of being formed on the entire area on the substrate. In this case, a probability that a short-circuit preventing function is lost due to a defect of the substrate itself is decreased.

When a serious defect is present in the substrate and when the first electrode, the short-circuit preventing layer, and the auxiliary electrode are formed on the defect portion, the short-circuit preventing layer anomalously operates due to the defect of the substrate and the current may directly flow from the auxiliary electrode to the first electrode. Specifically, when the short-circuit preventing layer is formed on the entire area of the first electrode, the short-circuit preventing layer is anomalously formed due to the surface defect of the substrate and thus, may not smoothly perform a short-circuit preventing function. More specifically, when the OLED is formed using a depositing process, the short-circuit preventing layer is greatly affected by a surface state of the substrate. That is, when the first electrode, the short-circuit preventing layer, the organic layer, and the second electrode are sequentially deposited on the substrate in a state in which foreign substances are present on the substrate, a contact area between the first electrode and the second electrode occurs due to the foreign substances and thus, the short-circuit preventing layer may not perform the short-circuit preventing function and the OLED may not operate.

Accordingly, the OLED according to an exemplary embodiment of the present specification may minimize a function loss of the short-circuit preventing layer resulting from the defect of the substrate by minimizing an area of the short-circuit preventing layer occupying on a substrate area. Further, even though the short circuit occurs at a point at which only the first electrode is formed due to the defect of the substrate, the short-circuit preventing layer may perform the short-circuit preventing function and prevent a case in which the entire OLED does not emit light.

When the short-circuit preventing layer is formed on an entire area of the first electrode and the organic layer is formed on an entire area of the short-circuit preventing layer, an issue that an amount of leakage current increases according to an increase in the short-circuit defect area arises in addition to a disadvantage in that the material of the short-circuit preventing layer may need to be transparent. The above issue is illustrated in a graph of FIG. 18. FIG. 18 illustrates an adverse effect resulting from a short-circuit defect area in a case in which the short-circuit preventing layer is formed on the entire area of the first electrode.

Specifically, FIG. 18 shows, as a percentage, leakage current by current-to-short circuit of a normal OLED resulting from an increase in a diameter of a short-circuit defect area when the operating voltage of the OLED is 6V, operating current density is 2 mA/cm$^2$, a size of the first electrode is 10×10 cm$^2$, volume resistance of the short-circuit preventing layer is 300,000Ω, and a thickness of the short-circuit preventing layer is 100 nm. As it can be known from FIG. 18, when the short-circuit preventing layer is formed on the entire area of the first electrode, the adverse effect resulting from the leakage current significantly increases according to an increase in the diameter of the short-circuit defect area.

In the OLED according to an exemplary embodiment of the present specification, the first electrode may include at least two patterned cells and the respective cells are electrically connected through the short-circuit preventing layer. Accordingly, regardless of a magnitude of the short circuit, there is an advantage in that the short-circuit preventing layer contacting with a cell in which the short circuit occurs may effectively reduce or prevent the leakage current.

Further, in the OLED according to an exemplary embodiment of the present specification, the first electrode may include at least two patterned cells. Accordingly, there is an advantage in that even though the short circuit occurs in any one cell area due to the defect of the substrate, a cell in which the short circuit does not occur may normally emit light.

Specifically, when the first electrode includes at least two patterned cells, resistance between the respective cells may be 70Ω or more. However, when the first electrode is not patterned, the resistance of the adjacent first electrode is only 10Ω or less. Accordingly, when the short circuit occurs in a partial area of the non-patterned first electrode, the leakage current flows into the short-circuit occurrence area and thus, may not be controlled. That is, each cell of the OLED according to an exemplary embodiment of the present specification is supplied with the current through the short-circuit preventing layer. Therefore, when the short-circuit defect occurs, it may be possible to effectively control the leakage current.

An exemplary embodiment of the present specification provides an OLED including: a substrate; a first electrode provided on the substrate; a second electrode provided to face the first electrode; at least one organic layer provided between the first electrode and the second electrode; a short-circuit preventing layer provided in contact with at least one of a top surface, a bottom surface, and a side surface of the first electrode; and an auxiliary electrode formed by providing the short-circuit preventing layer between the auxiliary electrode and the first electrode, wherein a current of the OLED is provided to flow in a direction of the auxiliary electrode, the short-circuit preventing layer, the first electrode, the organic layer, and the second electrode, or in a reverse direction thereof.

Also, an exemplary embodiment of the present specification provides an OLED including: a substrate; a first electrode formed on the substrate in a pattern that includes at least two cells separated from each other; a second electrode provided to face the first electrode; at least one organic layer provided between the first electrode and the second electrode; a short-circuit preventing layer provided to be in contact with at least a portion of each cell of the pattern of the first electrode; and an auxiliary electrode formed by providing the short-circuit preventing layer between the auxiliary electrode and the first electrode, wherein a current of the OLED is provided to flow in a direction of the auxiliary electrode, the short-circuit preventing layer, the first electrode, the organic layer, and the second electrode, or in a reverse direction thereof.

According to an exemplary embodiment of the present specification, the thickness of the short-circuit preventing layer may be 1 nm or more and 10 μm or less. The short-circuit preventing layer within the range may maintain normal operating voltage in a case in which the short circuit does not occur in the OLED. Also, the short-circuit preventing layer may perform the short-circuit preventing function. Even though the short circuit occurs, the OLED may operate within the normal range.

According to an exemplary embodiment of the present specification, resistance in a thickness direction of the short-circuit preventing layer may be 70Ω or more and 300,000Ω or less.

The resistance range may be a resistance range in the thickness direction of the short-circuit preventing layer positioned on each cell in a case in which the OLED includes at least two cells separated from each other.

Also, according to an exemplary embodiment of the present specification, resistance from one cell to another cell may be 140Ω or more and 600,000Ω or less.

The resistance of the short-circuit preventing layer may be calculated within an appropriate range of an operating voltage increase rate $((V_t-V_o)/V_o)$ and a numerical value of leakage current to operating current $(I_s/I_t)$, which are described below.

According to an exemplary embodiment of the present specification, the short-circuit preventing layer may include one or at least two selected from a group consisting of carbon powder; carbon film; conductive polymer; organic polymer; metal; metal oxide; inorganic oxide; metal sulfide; and insulating material. Specifically, the short-circuit preventing layer may use a mixture of at least two selected from a group consisting of zirconium oxide ($ZrO_2$), nichrome, indium tin oxide (ITO), zinc sulfide (ZnS), and silicon dioxide ($SiO_2$).

According to an exemplary embodiment of the present specification, it may be possible to inject current into each cell through the short-circuit preventing layer by dividing the OLED in a planar type into a large number of patterned cells.

In an OLED according to an exemplary embodiment of the present specification, $A(cm^2)$ denotes an entire light emitting area. Also, $V_o(V)$ denotes operating voltage of the OLED to which the short-circuit preventing layer is not applied when operating current density is $I_o(mA/cm^2)$ in a state in which the short-circuit defect is absent. Also, $V_t(V)$ denotes operating voltage of the OLED to which the short-circuit preventing layer is applied when the operating current density is $I_o(mA/cm^2)$ in a state in which the short-circuit defect is absent.

The OLED according to an exemplary embodiment of the present specification may divide an entire light emitting area $A(cm^2)$ into $n_{cell}$ and the respective patterned cells, connect in series the short-circuit preventing layer to each cell, and then connect in parallel all the combinations to a power. A circuit diagram thereof is illustrated in FIG. 2.

FIG. 1 illustrates a circuit diagram of a case in which a short circuit does not occur in an OLED in which a short-circuit preventing layer is absent.

FIG. 2 illustrates a circuit diagram of a case in which a short circuit does not occur in an OLED that includes a short-circuit preventing layer according to an exemplary embodiment of the present specification.

In a state in which the short-circuit defect is absent, the operating current $(I_t)(mA)$ of the OLED may be expressed by the following equation.

$$I_t = n_{cell} \times I_{cell}$$

$I_{cell}$ denotes current (mA) operating in one cell when the OLED normally operates.

A total number of patterned cells ($n_{cell}$) may be expressed by the following equation.

$$n_{cell} = \frac{A}{A_{cell}}$$

$A_{cell}$ denotes an area of a patterned cell.

Resistance $(R_{org})(\Omega)$ applied to an entire area of the OLED may be expressed by the following equation.

$$R_{org} = \frac{R_{cell-org}}{n_{cell}}$$

$R_{cell-org}(\Omega)$ denotes organic resistance $(\Omega)$ in one cell.

In a case in which the short-circuit preventing layer is added to each patterned cell, voltage increases when operating the OLED. Even though the short-circuit preventing layer is applied, it may be possible to control an efficiency of the OLED, because it may not be significantly decreased in a case in which the short circuit does not occur in the OLED. To be more specific, the operating voltage increase rate of the OLED acquired by adding the short-circuit preventing layer in a normal operating state of the OLED may be expressed by the following Equation 1.

$$\frac{V_t - V_o}{V_o} \qquad \text{[Equation 1]}$$

In Equation 1, $V_t(V)$ denotes operating voltage of the OLED to which the short-circuit preventing layer is applied and in which a short-circuit defect is absent, and $V_o(V)$ denotes operating voltage of the OLED to which the short-circuit preventing layer is not applied and in which the short-circuit defect is absent.

The operating voltage increase rate $((V_t-V_o)/V_o)$ may be calculated according to the following equation. Here, $R_{cell-spl}$ denotes resistance ($\Omega$) in the thickness direction of the short-circuit preventing layer in one cell. Specifically, $R_{cell-spl}$ may denote the thickness direction resistance of the short-circuit preventing layer in one cell.

$$\frac{V_t - V_o}{V_o} = \frac{R_{cell-spl}}{R_{cell-org}}$$

The operating voltage increase rate $((V_t-V_o)/V_o)$ may be induced according to the following equation.

$$V_o = \frac{I_t \times (R_{org})}{1000}$$

$$V_t = I_{cell} \times \frac{(R_{cell-org} + R_{cell-spl})}{1000}$$

In the case of the OLED in which the short-circuit preventing layer is absent, when current (mA) flowing through the normal organic layer when the short-circuit occurs is defined as $I_n$, current (mA) flowing into a short-circuit occurrence point is defined as $I_s$, and the resistance ($\Omega$) of the organic material at the short-circuit occurrence point is defined as $R_{org-s}$, $I_n$ and $I_s$ may be expressed as follows.

$$I_n = I_t \times \frac{R_{org-s}}{R_{org} + R_{org-s}} \approx 0$$

$$I_s = I_t \times \frac{R_{org}}{R_{org} + R_{org-s}} \approx I_t$$

That is, when the short circuit occurs in the OLED in which the short-circuit preventing layer is absent, all the set current leaks through the short-circuit occurrence point ($I_s$) while $R_{org-s}$ drops down to a value close to "0". Accordingly, the current may not flow in the normal organic layer and thus, the OLED may not emit light. With respect thereto, FIG. 3 illustrates a circuit diagram of a case in which the short circuit occurs in the OLED in which the short-circuit preventing layer is absent.

According to an exemplary embodiment of the present specification, in the case of the OLED in which the short-circuit preventing layer is provided in each cell, when $I_{n-cell}$ is defined as current (mA) flowing through a normal light emitting area when the short-circuit occurs, the voltage of each of parallel connected circuits is identical and a sum of current of all of the parallel connected circuits is identical to $I_t$ (operating current of the OLED). It can be verified from the following equation.

$$(R_{cell-org} + R_{cell-spl}) \times I_{n-cell} = (R_{cell-s} + R_{cell-spl}) \times I_s$$

$$I_t = I_{n-cell} \times (n_{cell} - 1) + I_s$$

Also, the leakage current may be calculated as follows.

$$I_s = I_t \times \frac{(R_{cell-org} + R_{cell-spl})}{(R_{cell-org} + R_{cell-spl}) + (n_{cell} - 1) \times (R_{cell-s} + R_{cell-spl})}$$

Accordingly, even though the organic layer of one light emitting area is short circuited in the OLED according to an exemplary embodiment of the present specification ($R_{cell-s}=0$), it may be possible to significantly decrease an amount of leakage current when a value of a denominator sufficiently increases, which can be known from the above equation. With respect thereto, FIG. 4 illustrates a circuit diagram of a case in which a short circuit occurs in an OLED including a short-circuit preventing layer according to an exemplary embodiment of the present specification.

Further, a numerical value of operating current ($I_t$) to leakage current ($I_s$) of the OLED may be expressed by the following Equation 2.

$$\frac{I_s}{I_t} \qquad \text{[Equation 2]}$$

In Equation 2, $I_t(mA)$ denotes operating current of the OLED having the same organic structure to which the short-circuit preventing layer is applied and in which the short-circuit defect is absent, and $I_s(mA)$ denotes leakage current in a defect area of the OLED to which the short-circuit preventing layer is applied and in which the short-circuit defect is present. Alternatively, when the first electrode is provided in a pattern that includes at least two cells separated from each other, $I_s(mA)$ denotes leakage current in an area to which the short-circuit preventing layer is applied and in which the short-circuit defect is present in any one cell.

A numerical value of operating current ($I_t$) to leakage current ($I_s$) of the OLED may be calculated according to the following equation.

$$\frac{I_s}{I_t} = \frac{(R_{cell-org} + R_{cell-spl})}{(R_{cell-org} + R_{cell-spl}) + (n_{cell} - 1) \times (R_{cell-s} + R_{cell-spl})}$$

According to an exemplary embodiment of the present specification, the short-circuit preventing layer may have a thickness direction resistance value at which the operating voltage increase rate $((V_t-V_o)/V_o$; Equation 1) and the numerical value of operating current to leakage current ($I_s/I_t$; Equation 2) of the OLED simultaneously satisfy 0.03 or less. More specifically, the short-circuit preventing layer may have a thickness direction resistance value at which the operating voltage increase rate $((V_t-V_o)/V_o)$ and the numerical value of operating current to leakage current ($I_s/I_t$) simultaneously satisfy 0.01 or less.

Specifically, according to an exemplary embodiment of the present specification, at current density of any one value of 1 mA/cm² to 5 mA/cm², the short-circuit preventing layer may have a thickness direction resistance value at which numerical values of the above Equation 1 and the above Equation 2 simultaneously satisfy 0.03 or less or 0.01 or less.

In a case in which all the conditions are identical, the above two numerical values (the operating voltage increase rate $((V_t-V_o)/V_o)$ and the numerical value of operating current to leakage current $(I_s/I_t)$) become lower according to an increase in a total number of patterned cells ($n_{cell}$) and thus, a maximum effect may be acquired. However, to increase a total number of patterned light emitting areas, a precision of a process may need to be improved and thus, the number of patterned light emitting areas may be determined at an applicable level in practice.

According to an exemplary embodiment of the present specification, a volume resistivity of the short-circuit preventing layer may be 0.63 Ω cm or more and 8.1×10¹⁰ Ω cm or less.

According to an exemplary embodiment of the present specification, the volume resistivity ($\rho_{slp}$) (Ω cm) of the short-circuit preventing layer may be calculated according to the following equation.

$$\rho_{spl} = \frac{R_{cell-spl} \times A_{spl}}{t_{spl}}$$

In the above equation, $A_{spl}$(cm²) may denote an area in which electricity may flow in a thickness direction from the auxiliary electrode formed on one cell to the first electrode of one cell through the short-circuit preventing layer. That is, $A_{spl}$(cm²) may denote an area overlapping an area of the auxiliary electrode formed on the short-circuit preventing layer in an area of the short-circuit preventing layer formed on one first electrode.

$R_{cell-spl}$ denotes resistance (Ω) of the short-circuit preventing layer in one cell.

$t_{slp}$(μm) denotes a thickness of the short-circuit preventing layer.

Specifically, $A_{spl}$(cm²) may denote an area of the short-circuit preventing layer simultaneously overlapping the first electrode formed thereon and the auxiliary electrode formed therebelow in a case in which the short-circuit preventing layer is positioned between the first electrode and the auxiliary electrode. As an example, when an entire bottom surface of the short-circuit preventing layer is formed on the first electrode in contact therewith and the auxiliary electrode is formed on an entire top surface of the short-circuit preventing layer in contact therewith, $A_{spl}$(cm²) may be an area of the short-circuit preventing layer overlapping the first electrode. As another example, when an entire bottom surface of the short-circuit preventing layer is formed on the first electrode in contact therewith and the auxiliary electrode is formed on a portion of the top surface of the short-circuit preventing layer, $A_{spl}$(cm²) may be an area of the short-circuit preventing layer simultaneously overlapping the first electrode and the auxiliary electrode.

In the above equation, $t_{slp}$(μm) denotes the thickness of the short-circuit preventing layer. That is, when the short-circuit preventing layer is formed on the first electrode, $t_{slp}$(μm) may denote a thickness in a vertical direction based on the top surface of the first electrode.

As can be known from the above equation, the volume resistivity ($\rho_{slp}$) of the short-circuit preventing layer formed on one cell may be determined based on the thickness direction resistance ($R_{cell-spl}$) of the short-circuit preventing layer in one cell, the area ($A_{spl}$) in which the electricity may flow in the thickness direction from the auxiliary electrode formed on one cell to the first electrode of one cell through the short-circuit preventing layer, and the thickness ($t_{slp}$) of the short-circuit preventing layer.

According to an exemplary embodiment of the present specification, the volume resistivity of the short-circuit preventing layer may be 0.63 Ω cm or more and 8.1×10¹⁰ Ω cm or less. Within the above range, the short-circuit preventing layer may maintain normal operating voltage in a case in which the short-circuit does not occur in the OLED. Also, the short-circuit preventing layer may perform a short-circuit preventing function. Even through the short circuit occurs, the OLED may operate within the normal range. However, the range of the volume resistivity according to an exemplary embodiment of the present specification may be a range in which the resistance of the short-circuit preventing layer suitable for performing the short-circuit preventing function is determined based on only the volume resistance of the short-circuit preventing layer. Therefore, according to an exemplary embodiment of the present specification, when contact resistance between the short-circuit preventing layer and the first electrode, or between the short-circuit preventing layer and the auxiliary electrode is significantly great, the range of the volume resistivity may become less than the numerical value. The volume resistivity may be calculated as follows.

According to an exemplary embodiment of the present specification, when a range of resistance in the thickness direction of the short-circuit preventing layer is 140Ω or more and 300,000Ω or less, the thickness of the short-circuit preventing layer is 1 nm or more and 10 μm or less, and an area of one cell is 300×300 μm² to 3×3 mm², the area ($A_{spl}$) in which the electricity may flow in the thickness direction from the auxiliary electrode formed on one cell to the first electrode of one cell through the short-circuit preventing layer may be determined within the range of 1% to 30% of the area of one cell. Accordingly, the area ($A_{spl}$) in which the electricity may flow in the thickness direction from the auxiliary electrode formed on one cell to the first electrode of one cell through the short-circuit preventing layer may be 9×10⁻⁶ cm² (300 μm×300 μm×0.01) to 2.7×10⁻² cm² (0.3 cm×0.3 cm×0.3). In this case, the volume resistivity of the short-circuit preventing layer may be calculated according to the following equation.

$$\frac{70\Omega \times 9 \times 10^{-6} \text{ cm}^2}{10 \text{ μm}} \leq \rho_{spl} \leq \frac{300,000\Omega \times 2.7 \times 10^{-2} \text{ cm}^2}{0.001 \text{ μm}}$$

According to an exemplary embodiment of the present specification, the auxiliary electrode may be formed of a metal material. That is, the auxiliary electrode may be a metal auxiliary electrode.

The auxiliary electrode may be formed of any type of metals. Specifically, the metals may include aluminum, copper, and/or silver having an excellent conductivity. In the case of using aluminum for stability during an adhesive power and photolithography process with a transparent electrode, the auxiliary electrode may also use a layer of molybdenum/aluminum/molybdenum.

According to an exemplary embodiment of the present specification, the first electrode may be a transparent electrode.

When the first electrode is the transparent electrode, the first electrode may be manufactured using conductive oxide such as indium tin oxide (ITO) or indium zinc oxide (IZO). Further, the first electrode may also be a translucent electrode. When the first electrode is the translucent electrode, the first electrode may be manufactured using a translucent metal such as Ag, Au, Mg, Ca, or the alloy thereof. When the translucent metal is used for the first electrode, the OLED may have a micro-cavity structure.

According to an exemplary embodiment of the present specification, the organic layer includes at least one light emitting layer. Also, according to an exemplary embodiment of the present specification, the organic layer may include at least one light emitting layer and may further include one or more selected from a group including a hole injecting layer; a hole transporting layer; a hole preventing layer; a charge generating layer; an electron preventing layer; an electron transporting layer; and an electron injecting layer.

The charge generating layer refers to a layer in which holes and electrons are generated when a voltage is applied thereto.

The substrate may use a substrate having a good transparency, surface smoothness, easy handling, and waterproof. Specifically, the substrate may use a glass substrate, a thin film glass substrate, or a transparent plastic substrate. The plastic substrate may include a film, such as polyethylene terephthalate (PET), polyethylene naphthalate (PEN), polyether ether ketone (PEEK), and polyimide (PO, in a form of a single layer or a plurality of layers. Also, a light scattering function may be included in the substrate itself. However, the substrate is not limited thereto. A substrate generally used for the OLED may be used.

According to an exemplary embodiment of the present specification, the first electrode may be an anode and the second electrode may be a cathode. Also, the first electrode may be the cathode and the second electrode may be the anode.

A material having a high work function may be used for the anode so that hole injection into the organic layer may be smoothly performed. Specific examples of an anode material may include a metal such as vanadium, chrome, copper, zinc, and gold, or the alloy thereof; metal oxide such as zinc oxide, indium oxide, indium tin oxide (ITO), and indium zinc oxide (IZO); a combination of a metal and oxide such as ZnO:Al or SnO$_2$:Sb; conductive polymer such as poly (3-methylthiophene), poly[3,4-(ethylene-1,2-dioxy) thiophene] (PEDOT), polypyrrole, and polyaniline, and the like, but are not limited thereto.

The anode material is not limited only to the anode and may be used as a material of the cathode.

A material having a low work function may be used for the cathode so that electron injection into the organic layer may be easily performed. Specific examples of a cathode material may include a metal such as magnesium, calcium, sodium, potassium, titanium, indium, yttrium, lithium, gadolinium, aluminum, silver, tin, and lead, or the alloy thereof; a multi-structured material such as LiF/Al or LiO$_2$/Al, and the like, but are not limited thereto.

The cathode material is not limited only to the cathode and may be used as a material of the anode.

A material having a high mobility with respect to holes may be suitable for a material of the hole transporting layer according to an exemplary embodiment of the present specification, which is a material capable of receiving holes from the anode or the hole injecting layer and transporting the holes to the light emitting layer. Specific examples thereof may include an arylamine-based organic material, conductive polymer, and block copolymer in which a conjugate portion and a non-conjugate portion are present together, but are limited thereto.

A material having a high quantum efficiency with respect to fluorescence or phosphorescence may be suitable for a material of the light emitting layer according to an exemplary embodiment of the present specification, which is a material capable of emitting light of a visible ray area by receiving holes and electrons from the hole transporting layer and the electron transporting layer, respectively, and thereby combining the holes and the electrons. Specific examples thereof may include 8-hydroxy-quinoline aluminum complex (Alq$_3$); carbazole-based compound; dimerized styryl compound; BAlq; 10-hydroxy benzoquinoline-metal compound; benzoxazole, benzthiazole and bezimidazole-based compound; poly (p-phenylenevinylene) (PPV) based polymer; spiro compound; polyfluorene; rubrene, and the like, but are not limited thereto.

A material having a high mobility with respect to electrons may be suitable for a material of the electron transporting layer according to an exemplary embodiment of the present specification, which is a material capable of well receiving electrons injected from the cathode and transporting the electrons to the light emitting layer. Specific examples thereof may include Al complex of 8-hydroxyquinoline; complex including Alq$_3$; organic radical compound; hydroxyflavone-metal complex, and the like, but are not limited thereto.

According to an exemplary embodiment of the present specification, the OLED may be sealed with an encapsulating layer.

The encapsulating layer may be formed as a transparent resin layer. The encapsulating layer may function to protect the OLED from oxygen and pollutants and may be formed of a transparent material in order not to degrade the luminescence of the OLED. The transparency indicates transmitting 60% or more of light. Specifically, the transparency indicates transmitting 75% or more of light.

FIG. 5 illustrates an OLED according to one of exemplary embodiments of the present specification. The OLED has a light emitting structure that includes a first electrode 2 and a second electrode 7 formed on a substrate 1 and is sealed with an encapsulation layer 8. As illustrated in FIG. 5, similar to a general OLED, an organic layer 6 is positioned between the first electrode 2 and the second electrode 7. Also, an auxiliary electrode 4 and a short-circuit preventing layer 3 do not directly contact with the organic layer 6.

FIG. 6 illustrates plan and cross-sectional views of an OLED according to one of exemplary embodiments of the present specification.

According to an exemplary embodiment of the present specification, the OLED may emit a white light having a color temperature of 2,000 K or more and 12,000 K or less.

According to an exemplary embodiment of the present specification, the OLED may include a light scattering layer.

Specifically, according to an exemplary embodiment of the present specification, the OLED may further include the light scattering layer between a substrate provided on a surface facing a surface on which the organic layer of the first electrode is provided and the first electrode. According to an exemplary embodiment of the present specification, the light scattering layer may include a flattening layer. According to an exemplary embodiment of the present specification, the flattening layer may be provided between the first electrode and the light scattering layer.

Alternatively, according to an exemplary embodiment of the present specification, the OLED may further include the light scattering layer provided on a surface facing a surface on which the first electrode of the substrate is provided.

According to an exemplary embodiment of the present specification, if the light scattering layer is provided in a structure capable of improving a light scattering efficiency of the OLED by inducing light scattering, the light scattering layer is not particularly limited. Specifically, according to an exemplary embodiment of the present specification, the light scattering layer may be provided in a structure in which scattering particles are distributed within a binder, a film having an unevenness, and/or a film having hazeness.

According to an exemplary embodiment of the present specification, the light scattering layer may be directly formed on the substrate using a method such as spin coating, bar coating, and slit coating, or may be formed using a method of manufacturing the light scattering layer in a film form and thereby attaching the same.

According to an exemplary embodiment of the present specification, the OLED may be a flexible OLED. In this case, the substrate may include a flexible material. Specifically, the substrate may be a bendable thin-film glass substrate, a plastic substrate, or a film type substrate.

A material of the plastic substrate is not particularly limited, but may generally include a film, such as polyethylene terephthalate (PET), polyethylene naphthalate (PEN), polyether ether ketone (PEEK), and polyimide (PI), in a form of a single layer or a plurality of layers.

An exemplary embodiment of the present specification provides a display device including an OLED. In the display device, the OLED may function as a pixel or a backlight. In addition, various configurations known in the art can be applied to the display device.

An exemplary embodiment of the present specification provides a lighting device including an OLED. In the lighting device, the OLED may function as a light emitter. In addition, various configurations known in the art may be applied to the lighting device.

An exemplary embodiment of the present specification provides a method for manufacturing the OLED. Specifically, the exemplary embodiment of the present specification provides the method for manufacturing the OLED, the method including: preparing a substrate; forming a first electrode on the substrate; forming a short-circuit preventing layer to be provided in contact with at least a portion of the first electrode; forming an auxiliary electrode to be provided by disposing the short-circuit preventing layer between the auxiliary electrode and the first electrode; forming at least one organic layer on the first electrode; and forming a second electrode on the organic layer.

Also, according to an exemplary embodiment of the present specification, a method for manufacturing the OLED may include: forming a first electrode on the substrate; forming a short-circuit preventing layer to be provided in contact with at least a portion of the first electrode; forming an auxiliary electrode layer on the short-circuit preventing layer; forming at least one organic layer on the first electrode; and forming a second electrode on the organic layer.

Also, according to an exemplary embodiment of the present specification, a method for manufacturing the OLED may include: forming an auxiliary electrode on the substrate; forming a short-circuit preventing layer on the auxiliary electrode; forming a first electrode to be provided in contact with at least a portion of the short-circuit preventing layer; forming at least one organic layer on the first electrode; and forming a second electrode on the organic layer.

Also, according to an exemplary embodiment of the present specification, a method for manufacturing the OLED may include: forming a short-circuit preventing layer on the substrate; forming an auxiliary electrode on the short-circuit preventing layer; forming a first electrode to be provided in contact with at least a portion of the short-circuit preventing layer; forming at least one organic layer on the first electrode; and forming a second electrode on the organic layer.

According to an exemplary embodiment of the present specification, the forming of the short-circuit preventing layer may be forming the short-circuit preventing layer on the substrate. Also, the forming of the short-circuit preventing layer may be forming the short-circuit preventing layer on the first electrode. Also, the forming of the short-circuit preventing layer may be forming a portion of the short-circuit preventing layer on the substrate and forming a remaining portion thereof on the first electrode.

According to an exemplary embodiment of the present specification, the first electrode may be formed after the short-circuit preventing layer is formed on the substrate.

According to an exemplary embodiment of the present specification, the short-circuit preventing layer may be formed after the first electrode is formed on the substrate.

According to an exemplary embodiment of the present specification, the organic layer may be formed on the substrate. Alternatively, the organic layer may be formed to cover the substrate, the first electrode, the short-circuit preventing layer, and the auxiliary electrode after the substrate, the first electrode, the short-circuit preventing layer, and the auxiliary electrode are formed.

According to an exemplary embodiment of the present specification, the forming of the first electrode may include patterning the first electrode. FIG. 7 illustrates a state of the first electrode after patterning the first electrode.

According to an exemplary embodiment of the present specification, the forming of the short-circuit preventing layer and the forming of the auxiliary electrode layer may include: forming the short-circuit preventing layer as a whole surface layer; forming the auxiliary electrode layer as a whole surface layer; and simultaneously patterning the short-circuit preventing layer and the auxiliary electrode layer formed as the whole surface layer. FIG. 8 illustrates a state after forming a short-circuit preventing layer and an auxiliary electrode layer on a first electrode, then patterning the short-circuit preventing layer and the auxiliary electrode layer in an OLED according to an exemplary embodiment of the present specification.

The patterned short-circuit preventing layer and auxiliary electrode may be provided in various designs. For example, a pattern formed with the auxiliary electrode on the short-circuit preventing layer in one cell may contact with at least one corner of the first electrode. Alternatively, a pattern formed with the auxiliary electrode on the short-circuit preventing layer may pass through one cell and thereby contact with the first electrode. A specific example thereof is illustrated in FIG. 16. Further, FIG. 17 illustrates a cross-section of the short-circuit preventing layer and the auxiliary electrode provided on any one cell of the patterned first electrode provided on the substrate.

According to an exemplary embodiment of the present specification, the method for manufacturing the OLED may further include forming an insulating layer on the short-circuit preventing layer and the auxiliary electrode. FIG. 9 illustrates a state acquired after forming the insulating layer.

According to an exemplary embodiment of the present specification, the method for manufacturing the OLED may further include encapsulating process after forming the second electrode.

EXAMPLES

A range of resistance in a thickness direction of a short-circuit preventing layer according to exemplary embodiments of the present specification will now be described in detail. However, the following examples are to exemplify contents of the present specification and thus, the scope of the present specification is not limited thereto.

Example 1

Range of Resistance in Thickness Direction of Short-Circuit Preventing Layer An OLED was manufactured to have about 1.2 E+04 of $n_{cell}$ by defining the light emitting area (A) of the OLED as 100 cm² and defining a length of one side of a cell ($L_{cell}$) as 900 μm. Here, operating voltage ($V_o$) of the OLED was 6V and operating current density ($I_o$) of the OLED was 3 mA/cm². In this case, an operating voltage increase rate $((V_t-V_o)/V_o)$ and a numerical value of leakage current to operating current ($I_s/I_t$) resulting from the thickness direction resistance ($R_{cell\text{-}spl}$) of the short-circuit preventing layer in one cell are expressed by the following Table 1. Also, a graph thereof is illustrated in FIG. 10.

In the following description, when the operating voltage increase rate $((V_t-V_o)/V_o)$ and the numerical value of operating current to leakage current ($I_s/I_t$) are expressed as %, it indicates that a value is acquired by multiplying the operating voltage increase rate $((V_t-V_o)/V_o)$ and the numerical value of operating current to leakage current ($I_s/I_t$) by 100.

TABLE 1

| $R_{cell\text{-}spl}$ | $I_s/I_t$ | $(V_t - V_o)/V_o$ |
| --- | --- | --- |
| 100 | 16.7% | 0.0% |
| 134 | 13.0% | 0.1% |
| 181 | 10.0% | 0.1% |
| 243 | 7.6% | 0.1% |
| 327 | 5.8% | 0.1% |
| 439 | 4.4% | 0.2% |
| 590 | 3.3% | 0.2% |
| 794 | 2.5% | 0.3% |
| 1,067 | 1.8% | 0.4% |
| 1,435 | 1.4% | 0.6% |
| 1,929 | 1.0% | 0.8% |
| 2,593 | 0.8% | 1.1% |
| 3,486 | 0.6% | 1.4% |
| 4,686 | 0.4% | 1.9% |
| 6,300 | 0.3% | 2.6% |
| 8,469 | 0.2% | 3.4% |
| 11,386 | 0.2% | 4.6% |
| 15,307 | 0.1% | 6.2% |
| 20,578 | 0.1% | 8.3% |
| 27,665 | 0.1% | 11.2% |
| 37,192 | 0.1% | 15.1% |
| 50,000 | 0.0% | 20.3% |

Example 2

Range of Resistance in Thickness Direction of Short-Circuit Preventing Layer An OLED was manufactured to have about 1.1 E+05 of $n_{cell}$ by defining the light emitting area (A) of the OLED as 900 cm² and defining a length of one side of a cell ($L_{cell}$) as 900 μm. Here, operating voltage ($V_o$) of the OLED was 6V and operating current density ($I_o$) of the OLED was 3 mA/cm². In this case, an operating voltage increase rate $((V_t-V_o)/V_o)$ and a numerical value of leakage current to operating current ($I_s/I_t$) resulting from the thickness direction resistance ($R_{cell\text{-}spl}$) of the short-circuit preventing layer in one cell are expressed by the following Table 2. Also, a graph thereof is illustrated in FIG. 11.

TABLE 2

| $R_{cell\text{-}spl}$ | $I_s/I_t$ | $(V_t - V_o)/V_o$ |
| --- | --- | --- |
| 10 | 18.2% | 0.0% |
| 15 | 12.9% | 0.0% |
| 23 | 9.0% | 0.0% |
| 34 | 6.2% | 0.0% |
| 51 | 4.2% | 0.0% |
| 76 | 2.8% | 0.0% |
| 114 | 1.9% | 0.0% |
| 171 | 1.3% | 0.1% |
| 257 | 0.9% | 0.1% |
| 385 | 0.6% | 0.2% |
| 577 | 0.4% | 0.2% |
| 866 | 0.3% | 0.4% |
| 1,299 | 0.2% | 0.5% |
| 1,949 | 0.1% | 0.8% |
| 2,924 | 0.1% | 1.2% |
| 4,387 | 0.1% | 1.8% |
| 6,581 | 0.0% | 2.7% |
| 9,872 | 0.0% | 4.0% |
| 14,810 | 0.0% | 6.0% |
| 22,217 | 0.0% | 9.0% |
| 33,329 | 0.0% | 13.5% |
| 50,000 | 0.0% | 20.3% |

Example 3

Range of Resistance in Thickness Direction of Short-Circuit Preventing Layer An OLED was manufactured to have about 1.2 E+04 of $n_{cell}$ by defining the light emitting area (A) of the OLED as 100 cm² and defining a length of one side of a cell ($L_{cell}$) as 900 μm. Here, operating voltage ($V_o$) of the OLED was 6V and operating current density ($I_o$) of the OLED was 6 mA/cm². In this case, an operating voltage increase rate $((V_t-V_o)/V_o)$ and a numerical value of leakage current to operating current ($I_s/I_t$) resulting from the thickness direction resistance ($R_{cell\text{-}spl}$) of the short-circuit preventing layer in one cell are expressed by the following Table 3. Also, a graph thereof is illustrated in FIG. 12.

TABLE 3

| $R_{cell\text{-}spl}$ | $I_s/I_t$ | $(V_t - V_o)/V_o$ |
| --- | --- | --- |
| 50 | 16.7% | 0.0% |
| 67 | 13.0% | 0.1% |
| 90 | 10.0% | 0.1% |
| 121 | 7.6% | 0.1% |
| 163 | 5.8% | 0.1% |
| 220 | 4.4% | 0.2% |
| 295 | 3.3% | 0.2% |
| 397 | 2.5% | 0.3% |
| 534 | 1.8% | 0.4% |
| 717 | 1.4% | 0.6% |
| 964 | 1.0% | 0.8% |
| 1,296 | 0.8% | 1.1% |
| 1,743 | 0.6% | 1.4% |
| 2,343 | 0.4% | 1.9% |
| 3,150 | 0.3% | 2.6% |
| 4,235 | 0.2% | 3.4% |
| 5,693 | 0.2% | 4.6% |
| 7,653 | 0.1% | 6.2% |
| 10,289 | 0.1% | 8.3% |
| 13,832 | 0.1% | 11.2% |

TABLE 3-continued

| $R_{cell\text{-}spl}$ | $I_s/I_t$ | $(V_t - V_o)/V_o$ |
|---|---|---|
| 18,596 | 0.1% | 15.1% |
| 25,000 | 0.0% | 20.3% |

Example 4

Range of Resistance in Thickness Direction of Short-Circuit Preventing Layer

An OLED was manufactured to have about 4.9 E+04 of $n_{cell}$ by defining the light emitting area (A) of the OLED as 100 cm² and defining a length of one side of a cell ($L_{cell}$) as 450 μm. Here, operating voltage ($V_o$) of the OLED was 6V and operating current density ($I_o$) of the OLED was 3 mA/cm². In this case, an operating voltage increase rate (($V_t-V_o$)/$V_o$) and a numerical value of leakage current to operating current ($I_s/I_t$) resulting from the thickness direction resistance ($R_{cell\text{-}spl}$) of the short-circuit preventing layer in one cell are expressed by the following Table 4. Also, a graph thereof is illustrated in FIG. 13.

TABLE 4

| $R_{cell\text{-}spl}$ | $I_s/I_t$ | $(V_t - V_o)/V_o$ |
|---|---|---|
| 100 | 16.7% | 0.0% |
| 144 | 12.2% | 0.0% |
| 206 | 8.8% | 0.0% |
| 296 | 6.3% | 0.0% |
| 425 | 4.5% | 0.0% |
| 611 | 3.2% | 0.1% |
| 877 | 2.2% | 0.1% |
| 1,260 | 1.6% | 0.1% |
| 1,809 | 1.1% | 0.2% |
| 2,599 | 0.8% | 0.3% |
| 3,732 | 0.5% | 0.4% |
| 5,359 | 0.4% | 0.5% |
| 7,697 | 0.3% | 0.8% |
| 11,053 | 0.2% | 1.1% |
| 15,874 | 0.1% | 1.6% |
| 22,797 | 0.1% | 2.3% |
| 32,739 | 0.1% | 3.3% |
| 47,018 | 0.0% | 4.8% |
| 67,523 | 0.0% | 6.8% |
| 96,972 | 0.0% | 9.8% |
| 139,264 | 0.0% | 14.1% |
| 200,000 | 0.0% | 20.3% |

Example 5

Range of Resistance in Thickness Direction of Short-Circuit Preventing Layer

An OLED was manufactured to have about 1.2 E+04 of $n_{cell}$ by defining the light emitting area (A) of the OLED as 100 cm² and defining a length of one side of a cell ($L_{cell}$) as 900 μm. Here, operating voltage ($V_o$) of the OLED was 9V and operating current density ($I_o$) of the OLED was 3 mA/cm². In this case, an operating voltage increase rate (($V_t-V_o$)/$V_o$) and a numerical value of leakage current to operating current ($I_s/I_t$) resulting from the thickness direction resistance ($R_{cell\text{-}spl}$) of the short-circuit preventing layer in one cell are expressed by the following Table 5. Also, a graph thereof is illustrated in FIG. 14.

TABLE 5

| $R_{cell\text{-}spl}$ | $I_s/I_t$ | $(V_t - V_o)/V_o$ |
|---|---|---|
| 100 | 23.1% | 0.0% |
| 137 | 17.9% | 0.0% |
| 189 | 13.7% | 0.1% |
| 260 | 10.4% | 0.1% |
| 357 | 7.8% | 0.1% |
| 491 | 5.8% | 0.1% |
| 675 | 4.3% | 0.2% |
| 928 | 3.1% | 0.3% |
| 1,276 | 2.3% | 0.3% |
| 1,755 | 1.7% | 0.5% |
| 2,412 | 1.2% | 0.7% |
| 3,316 | 0.9% | 0.9% |
| 4,559 | 0.7% | 1.2% |
| 6,268 | 0.5% | 1.7% |
| 8,618 | 0.4% | 2.3% |
| 11,848 | 0.3% | 3.2% |
| 16,288 | 0.2% | 4.4% |
| 22,393 | 0.1% | 6.0% |
| 30,787 | 0.1% | 8.3% |
| 42,326 | 0.1% | 11.4% |
| 58,190 | 0.1% | 15.7% |
| 80,000 | 0.0% | 21.6% |

Example 6

Range of Resistance in Thickness Direction of Short-Circuit Preventing Layer

An OLED was manufactured to have about 1.0 E+06 of $n_{cell}$ by defining the light emitting area (A) of the OLED as 900 cm² and defining a length of one side of a cell ($L_{cell}$) as 300 μm. Here, operating voltage ($V_o$) of the OLED was 9V and operating current density ($I_o$) of the OLED was 1 mA/cm². In this case, an operating voltage increase rate (($V_t-V_o$)/$V_o$) and a numerical value of leakage current to operating current ($I_s/I_t$) resulting from the thickness direction resistance ($R_{cell\text{-}spl}$) of the short-circuit preventing layer in one cell are expressed by the following Table 6. Also, a graph thereof is illustrated in FIG. 15.

TABLE 6

| $R_{cell\text{-}spl}$ | $I_s/I_t$ | $(V_t - V_o)/V_o$ |
|---|---|---|
| 40 | 20.0% | 0.0% |
| 67 | 13.0% | 0.0% |
| 112 | 8.2% | 0.0% |
| 188 | 5.1% | 0.0% |
| 314 | 3.1% | 0.0% |
| 526 | 1.9% | 0.0% |
| 880 | 1.1% | 0.0% |
| 1,474 | 0.7% | 0.0% |
| 2,467 | 0.4% | 0.0% |
| 4,130 | 0.2% | 0.0% |
| 6,913 | 0.1% | 0.1% |
| 11,572 | 0.1% | 0.1% |
| 19,373 | 0.1% | 0.2% |
| 32,430 | 0.0% | 0.3% |
| 54,288 | 0.0% | 0.5% |
| 90,880 | 0.0% | 0.9% |
| 152,134 | 0.0 | 1.5% |
| 254,676 | 0.0% | 2.5% |
| 426,333 | 0.0% | 4.3% |
| 713,689 | 0.0% | 7.1% |
| 1,194,729 | 0.0% | 11.9% |
| 2,000,000 | 0.0% | 20.0% |

A range of resistance in the thickness direction of the short-circuit preventing layer at a level available in the OLED can be verified to be about 70Ω or more and about 300,000Ω or less, based on the aforementioned Examples 1 through 6.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

EXPLANATION OF SYMBOLS

1: Substrate
2: First electrode
3: Short-circuit preventing layer
4: Auxiliary electrode
5: Insulating layer
6: Organic layer
7: Second electrode
8: Encapsulation layer

What is claimed is:

1. An organic light emitting device (OLED) comprising:
   a first electrode and a second electrode on a substrate, the first electrode having a pattern of a plurality of cells, with each cell defined with an emitting area and a non-emitting area;
   one or more organic material layers between the first electrode and the second electrode;
   an auxiliary electrode between the substrate and the second electrode; and
   a short-circuit preventing layer contacting at least a portion of the first electrode and at least a portion of the auxiliary electrode,
   wherein both the auxiliary electrode and the short-circuit preventing layer are interposed between the first electrode and the second electrode.

2. The OLED of claim 1, wherein a current of the OLED flows in a direction of the auxiliary electrode, the short-circuit preventing layer, the first electrode, the one or more organic material layers, and the second electrode, or in a reverse direction thereof.

3. The OLED of claim 1, wherein the short-circuit preventing layer contacts at least one of a top surface and a side surface of the first electrode in each cell.

4. The OLED of claim 3, wherein the auxiliary electrode contacts at least a portion of the short-circuit preventing layer and the auxiliary electrode is separated from the first electrode in each cell.

5. The OLED of claim 3, wherein the auxiliary electrode contacts a top surface of the short-circuit preventing layer in each cell; or
   the short-circuit preventing layer contacts the side surface of the first electrode and the auxiliary electrode contacts a bottom surface of the short-circuit preventing layer in each cell.

6. The OLED of claim 5, wherein the short-circuit preventing layer is provided in contact with the top surface of the first electrode or the substrate and the auxiliary electrode is provided in contact with the top surface of the short-circuit preventing layer in each cell; or
   the auxiliary electrode is provided in contact with a top surface of the substrate and the short-circuit preventing layer is provided between the auxiliary electrode and the first electrode in each cell.

7. The OLED of claim 1, wherein a thickness of the emitting area and a thickness of the non-emitting area are different from each other.

8. The OLED of claim 1, wherein an insulating layer is additionally provided between the short-circuit preventing layer and the organic material layers, and between the auxiliary electrode and the one or more organic material layers; or
   an insulating layer is additionally provided between the short-circuit preventing layer and the second electrode, and between the auxiliary electrode and the second electrode.

9. The OLED of claim 1, wherein a thickness of the short-circuit preventing layer is from 1 nm to 10 µm.

10. The OLED of claim 1, wherein a volume resistivity of the short-circuit preventing layer is from 0.63 Ωcm to $8.1 \times 10^{10}$ Ωcm.

11. The OLED of claim 1, wherein the short-circuit preventing layer includes one or more selected from a group consisting of a carbon powder, a carbon film, a conductive polymer, an organic polymer, a metal, a metal oxide, an inorganic oxide, a metal sulfide, and an insulating material.

12. The OLED of claim 1, wherein, at a current density of any one value of 1 mA/cm² to 5 mA/cm², the short-circuit preventing layer has a thickness direction resistance value at which an operating voltage increase rate of the following Equation 1 and a numerical value of leakage current to operating current of the following Equation 2 simultaneously satisfy 0.03 or less:

$$\frac{V_t - V_o}{V_o} \quad \text{[Equation 1]}$$

$$\frac{I_s}{I_t} \quad \text{[Equation 2]}$$

where $V_t$(V) denotes an operating voltage of the OLED to which the short-circuit preventing layer is applied and in which a short-circuit defect is absent,
$V_o$(V) denotes an operating voltage of the OLED to which the short-circuit preventing layer is not applied and in which the short-circuit defect is absent,
$I_t$(mA) denotes an operating current of the OLED having the same organic structure to which the short-circuit preventing layer is applied and in which the short-circuit defect is absent, and
$I_s$(mA) denotes a leakage current in a defect area of the OLED to which the short-circuit preventing layer is applied and in which the short-circuit defect is present.

13. The OLED of claim 1, further comprising:
   a light scattering layer between the substrate and the first electrode.

14. The OLED of claim 13, wherein the light scattering layer includes a flattening layer.

15. The OLED of claim 1, further comprising:
   a light scattering layer on a surface facing a surface on which the first electrode of the substrate is provided.

16. The OLED of claim 1, wherein an aperture ratio of each cell is 30% or more.

17. An organic light emitting device (OLED), comprising:
   a first electrode on a substrate, the first electrode having a pattern of a plurality of cells, with each cell defined with an emitting area and a non-emitting area;
   one or more organic material layers on the first electrode;
   a second electrode on the one or more organic material layers;
   an auxiliary electrode between the substrate and the second electrode;
   a short-circuit preventing layer contacting at least a part of the auxiliary electrode; and
   an insulating layer covering the auxiliary electrode, wherein both the auxiliary electrode and the short-circuit preventing layer are interposed between the first electrode and the second electrode.

18. The OLED of claim 17, wherein the insulating layer covers a top surface of the auxiliary electrode.

19. The OLED of claim 17, wherein the insulating layer is between the short-circuit preventing layer and the organic material layers, and between the auxiliary electrode and the one or more organic material layers.

20. The OLED of claim 17, wherein the insulating layer is between the short-circuit preventing layer and the second electrode, and between the auxiliary electrode and the second electrode.

21. The OLED of claim 17, wherein the insulating layer is between the first electrode of a first cell of the plurality of cells and the first electrode of a second cell of the plurality of cells adjacent to the first cell.

22. The OLED of claim 21, wherein the insulating layer contacts the substrate between the first electrode of the first cell of the plurality of cells and the first electrode of the second cell of the plurality of cells.

23. The OLED of claim 17, wherein the OLED is a flexible OLED.

\* \* \* \* \*